(12) United States Patent
Cardwell et al.

(10) Patent No.: US 11,444,216 B2
(45) Date of Patent: Sep. 13, 2022

(54) POWER PHOTODIODE STRUCTURES, METHODS OF MAKING, AND METHODS OF USE

(71) Applicant: SLT Technologies, Inc, Los Angeles, CA (US)

(72) Inventors: Drew W. Cardwell, Camas, WA (US); Mark P. D'Evelyn, Vancouver, WA (US)

(73) Assignee: SLT Technologies, Inc., Los Angeles, CA (US)

( * ) Notice: Subject to any disclaimer, the term of this patent is extended or adjusted under 35 U.S.C. 154(b) by 54 days.

(21) Appl. No.: 16/930,250

(22) Filed: Jul. 15, 2020

(65) Prior Publication Data

US 2021/0020798 A1 Jan. 21, 2021

Related U.S. Application Data

(60) Provisional application No. 62/874,487, filed on Jul. 15, 2019, provisional application No. 62/978,281, filed on Feb. 18, 2020.

(51) Int. Cl.
*H01L 31/036* (2006.01)
*H01L 31/0224* (2006.01)
(Continued)

(52) U.S. Cl.
CPC ...... *H01L 31/036* (2013.01); *H01L 31/02327* (2013.01); *H01L 31/022408* (2013.01);
(Continued)

(58) Field of Classification Search
CPC .......... H01L 31/036; H01L 31/022408; H01L 31/02327; H01L 31/03044;
(Continued)

(56) References Cited

U.S. PATENT DOCUMENTS

| 5,883,988 A | 3/1999 | Yamamoto et al. |
| 5,937,274 A | 8/1999 | Kondow et al. |

(Continued)

FOREIGN PATENT DOCUMENTS

| CN | 107046071 A | 8/2017 | |
| WO | 2002054129 | 7/2002 | |
| WO | WO-2014141028 A1 * | 9/2014 | ............. H01L 33/16 |

OTHER PUBLICATIONS

International Search Report dated Sep. 4, 2020 for Application No. PCT/US2020/042205.

(Continued)

*Primary Examiner* — Sitaramarao S Yechuri
(74) *Attorney, Agent, or Firm* — Patterson + Sheridan LLP

(57) ABSTRACT

According to the present disclosure, techniques related to manufacturing and applications of power photodiode structures and devices based on group-III metal nitride and gallium-based substrates are provided. More specifically, embodiments of the disclosure include techniques for fabricating photodiode devices comprising one or more of GaN, AlN, InN, InGaN, AlGaN, and AlInGaN, structures and devices. Such structures or devices can be used for a variety of applications including optoelectronic devices, photodiodes, power-over-fiber receivers, and others.

26 Claims, 18 Drawing Sheets

(51) Int. Cl.
*H01L 31/0232* (2014.01)
*H01L 31/0304* (2006.01)
*H01L 31/105* (2006.01)
*H01L 31/18* (2006.01)

(52) U.S. Cl.
CPC .. *H01L 31/03044* (2013.01); *H01L 31/03048* (2013.01); *H01L 31/105* (2013.01); *H01L 31/1848* (2013.01); *H01L 31/1856* (2013.01); *H01L 31/1892* (2013.01)

(58) Field of Classification Search
CPC .............. H01L 31/03048; H01L 31/105; H01L 31/1848; H01L 31/1856; H01L 31/1892; H01L 31/0547; H01L 31/0693; Y02E 10/52; Y02E 10/544
See application file for complete search history.

(56) References Cited

U.S. PATENT DOCUMENTS

| | | | |
|---|---|---|---|
| 6,297,495 B1 | 10/2001 | Bulovic et al. | |
| 6,333,458 B1* | 12/2001 | Forrest .................. | H01L 27/301 136/246 |
| 6,440,769 B2* | 8/2002 | Peumans ............ | G02B 19/0023 438/65 |
| 6,806,508 B2 | 10/2004 | D'Evelyn et al. | |
| 7,119,372 B2 | 10/2006 | Stokes et al. | |
| 8,148,801 B2 | 4/2012 | D'Evelyn | |
| 8,455,894 B1 | 6/2013 | D'Evelyn et al. | |
| 8,866,149 B2 | 10/2014 | Holder et al. | |
| 9,917,227 B1 | 3/2018 | Hurni et al. | |
| 2006/0000976 A1 | 1/2006 | Brouns | |
| 2006/0255341 A1 | 11/2006 | Pinnington et al. | |
| 2008/0123198 A1 | 5/2008 | Fujita | |
| 2010/0147382 A1* | 6/2010 | Chiang ............... | H01L 31/0547 136/259 |
| 2013/0250991 A1* | 9/2013 | Homewood .......... | H01L 31/108 372/44.01 |
| 2014/0147650 A1 | 5/2014 | Jiang et al. | |
| 2014/0353713 A1 | 12/2014 | Kuh et al. | |
| 2015/0146757 A1 | 5/2015 | Ohki et al. | |
| 2015/0221803 A1 | 8/2015 | Arias | |
| 2016/0020284 A1* | 1/2016 | D'Evelyn ............. | C30B 29/406 428/64.1 |
| 2018/0195206 A1 | 7/2018 | Jiang et al. | |
| 2019/0088495 A1 | 3/2019 | Youtsey et al. | |
| 2019/0115497 A1 | 4/2019 | Zhang et al. | |
| 2019/0288132 A1 | 9/2019 | Wang et al. | |

OTHER PUBLICATIONS

International Search Report dated Apr. 19, 2021, Application No. PCT/US2020/066900.
Asgari, A., Khalili, K. (2011). Temperature dependence of InGaN/GaN multiple quantum well based high efficiency solar cell. Solar Energy Materials and Solar Cells, 95(11), 3124-3129. https://doi.org/10.1016/j.solmat.2011.07.001.
Bae, S.-Y., Shim, J.-P., Lee, D.-S., Jeon, S.-R., Namkoong, G. (2011). Improved Photovoltaic Effects of a Vertical-Type InGaN/GaN Multiple Quantum Well Solar Cell. Japanese Journal of Applied Physics, 50(98), 092301.
Bai, J., Yang, C. C., Athanasiou, M., Wang, T. (2014). Efficiency enhancement of InGaN/GaN solar cells with nanostructures. Applied Physics Letters, 104(5), 051129. https://doi.org/10.1063/1.4864640.
Cai, X. M., Zeng, S. W., Zhang, B. P. (2009). Fabrication and characterization of InGaN p-i-n homojunction solar cell. Applied Physics Letters, 95(17), 173504. https://doi.org/10.1063/1.3254215.
Chen, X., Matthews, K. D., Hao, D., Schaff, W. J., Eastman, L. F. (2008). Growth, fabrication, and characterization of InGaN solar cells. Physica Status Solidi (A) Applications and Materials Science, 205(5), 1103-1105. https://doi.org/10.1002/pssa.200778695.
Chen, Z., Zheng, X., Li, Z., Wang, P., Rong, X., Wang, T., Yang, X., Xu, F., Qin, Z., Ge, W., Shen, B., Wang, X. (2016). Positive temperature coefficient of photovoltaic efficiency in solar cells based on InGaN/GaN MQWs. Applied Physics Letters, 109(6), 062104. https://doi.org/10.1063/1.4960765.
Choi, S. B., Shim, J. P., Kim, D. M., Jeong, H. Il, Jho, Y. D., Song, Y. H., Lee, D. S. (2013). Effect of indium composition on carrier escape in InGaN/GaN multiple quantum well solar cells. Applied Physics Letters, 103(3), 033901. https://doi.org/10.1063/1.4813623.
Dahal, R., Li, J., Aryal, K., Lin, J. Y., Jiang, H. X. (2010). InGaN/GaN multiple quantum well concentrator solar cells. Applied Physics Letters, 97(7), 073115. https://doi.org/10.1063/1.3481424.
Dahal, R., Pantha, B., Li, J., Lin, J. Y., Jiang, H. X. (2009). InGaN/GaN multiple quantum well solar cells with long operating wavelengths. Applied Physics Letters, 94(6), 063505. https://doi.org/10.1063/1.3081123.
De Santi, C., Meneghini, M., Caria, A., Dogmus, E., Zegaoui, M., Medjdoub, F., Kalinic, B., Cesca, T., Meneghesso, G., Zanoni, E. (2018). GaN-based laser wireless power transfer system. Materials, 11(1), 153. https://doi.org/10.3390/ma11010153.
El Gmili, Y., Orsal, G., Pantzas, K., Moudakir, T., Sundaram, S., Patriarche, G., Hester, J., Ahaitouf, A., Salvestrini, J. P., Ougazzaden, A. (2013). Multilayered InGaN/GaN structure vs. single InGaN layer for solar cell applications: A comparative study. Acta Materialia, 61(17), 6587-6596. https://doi.org/10.1016/j.actamat.2013.07.041.
Farrell, R. M., Neufeld, C. J., Cruz, S. C., Lang, J. R., Iza, M., Keller, S., Nakamura, S., Denbaars, S. P., Mishra, U. K., Speck, J. S. (2011). High quantum efficiency InGaN/GaN multiple quantum well solar cells with spectral response extending out to 520 nm. Applied Physics Letters, 98(20), 201107. https://doi.org/10.1063/1.3591976.
Horng, R. H., Lin, S. T., Tsai, Y. L., Chu, M. T., Liao, W. Y., Wu, M. H., Lin, R. M., Lu, Y. C. (2009). Improved conversion efficiency of GaN/InGaN thin-film solar cells. IEEE Electron Device Letters, 30(7), 724-726. https://doi.org/10.1109/LED.2009.2021414.
Iida, D., Kondo, Y., Sowa, M., Sugiyama, T., Iwaya, M., Takeuchi, T., Kamiyama, S., Akasaki, I. (2013). Analysis of strain relaxation process in GaInN/GaN heterostructure by in situ X-ray diffraction monitoring during metalorganic vapor-phase epitaxial growth. Physica Status Solidi—Rapid Research Letters, 7(3), 211-214. https://doi.org/10.1002/pssr.201307023.
Jani, O. K. (2008). Development of Wide-Band Gap InGaN Solar Cells for High-Efficiency Photovoltaics A Dissertation Presented to the Academic Faculty. Georgia Institute of Technology.
Jani, O., Ferguson, I., Honsberg, C., Kurtz, S. (2007). Design and characterization of GaNInGaN solar cells. Applied Physics Letters, 91(13), 132117. https://doi.org/10.1063/1.2793180.
Jani, O., Honsberg, C., Asghar, A., Nicol, D., Ferguson, I., Doolittle, A., Kurtz, S. (2005). Characterization and Analysis of InGaN Photovoltaic Devices. Conference Record of the Thirty-First IEEE Photovoltaic Specialists Conference, 37-42. https://doi.org/10.1109/PVSC.2005.1488064.
Jani, O., Honsberg, C., Huang, Y., Song, J.-O., Ferguson, I., Namkoong, G., Trybus, E., Doolittle, A., Kurtz, S. (2006). Design, Growth, Fabrication and Characterization of High-Band Gap InGaN/GaN Solar Cells. IEEE 4th World Conference on Photovoltaic Energy Conference, 20-25. https://doi.org/10.1109/WCPEC.2006.279337.
Jeng, M. J. (2010). Influence of polarization on the efficiency of InxGa 1-xN/GaN p-i-n solar cells. Japanese Journal of Applied Physics, 49(12), 128001. https://doi.org/10.1143/JJAP.49.128001.
Jeng, M. J., Su, T. W., Lee, Y. L., Chang, Y. H., Chang, L. B., Lin, R. M., Jiang, J. H., Lu, Y. C. (2010). Effect of silicon doping on performance of 30-pair InxGa 1-xN/GaN quantum well solar cells. Japanese Journal of Applied Physics, 49(5 Part 1), 0523021-0523024. https://doi.org/10.1143/JJAP.49.052302.
Ju, G., Tabuchi, M., Takeda, Y., Amano, H. (2017). Role of threading dislocations in strain relaxation during GaInN growth monitored by real-time X-ray reflectivity. Applied Physics Letters, 110(26), 262105. https://doi.org/10.1063/1.4990687.
Kuo, Y. K., Chang, J. Y., Shih, Y. H. (2012). Numerical study of the effects of hetero-interfaces, polarization charges, and step-graded

(56) References Cited

OTHER PUBLICATIONS interlayers on the photovoltaic properties of (0001) face GaN/InGaN p-i-n solar cell. IEEE Journal of Quantum Electronics, 48(3), 367-374. https://doi.org/10.1109/JQE.2011.2181972.

Kuwahara, Y., Fujii, T., Fujiyama, Y., Sugiyama, T., Iwaya, M., Takeuchi, T., Kamiyama, S., Akasaki, I., Amano, H. (2010). Realization of nitride-based solar cell on freestanding GaN substrate. Applied Physics Express, 3(11), 111001. https://doi.org/10.1143/APEX.3.111001.

Kuwahara, Y., Fujii, T., Sugiyama, T., Iida, D., Isobe, Y., Fujiyama, Y., Morita, Y., Iwaya, M., Takeuchi, T., Kamiyama, S., Akasaki, I., Amano, H. (2011). GaInN-based solar cells using strained-layer GaInN/GaInN superlattice active layer on a freestanding GaN substrate. Applied Physics Express, 4(2), 021001. https://doi.org/10.1143/APEX.4.021001.

Lang, J. R., Neufeld, C. J., Humi, C. A., Cruz, S. C., Matioli, E., Mishra, U. K., Speck, J. S. (2011). High external quantum efficiency and fill-factor InGaN/GaN heterojunction solar cells grown by NH3-based molecular beam epitaxy. Applied Physics Letters, 98(13), 131115. https://doi.org/10.1063/1.3575563.

Li, Z. Q., Lestradet, M., Xiao, Y. G., Li, S. (2011). Effects of polarization charge on the photovoltaic properties of InGaN solar cells. Physica Status Solidi (A) Applications and Materials Science, 208(4), 928-931. https://doi.org/10.1002/pssa.201026489.

Lu, N., Ferguson, I. (2013). III-nitrides for energy production: Photovoltaic and thermoelectric applications. In Semiconductor Science and Technology (vol. 28, Issue 7, pp. 1-11). https://doi.org/10.1088/0268-1242/28/7/074023.

Matioli, E., Neufeld, C., Iza, M., Cruz, S. C., Al-Heji, A. A., Chen, X., Farrell, R. M., Keller, S., DenBaars, S., Mishra, U., Nakamura, S., Speck, J., Weisbuch, C. (2011). High internal and external quantum efficiency InGaN/GaN solar cells. Applied Physics Letters, 98(2), 021102. https://doi.org/10.1063/1.3540501.

Mukhtarova, A., Valdueza-Felip, S., Redaelli, L., Durand, C., Bougerol, C., Monroy, E., Eymery, J. (2016). Dependence of the photovoltaic performance of pseudomorphic InGaN/GaN multiple-quantum-well solar cells on the active region thickness. Applied Physics Letters, 108(16), 161907. https://doi.org/10.1063/1.4947445.

Neufeld, C. J., Cruz, S. C., Farrell, R. M., Iza, M., Lang, J. R., Keller, S., Nakamura, S., Denbaars, S. P., Speck, J. S., Mishra, U. K. (2011). Effect of doping and polarization on carrier collection in InGaN quantum well solar cells. Applied Physics Letters, 98(24), 243507. https://doi.org/10.1063/1.3595487.

Neufeld, C. J., Toledo, N. G., Cruz, S. C., Iza, M., DenBaars, S. P., Mishra, U. K. (2008). High quantum efficiency InGaN/GaN solar cells with 2.95 eV band gap. Applied Physics Letters, 93(14), 143502. https://doi.org/10.1063/1.2988894.

Pernot, C., Hirano, A., Iwaya, M., Detchprohm, T., Amano, H., Akasaki, I. (2000). Solar-Blind UV Photodetectors Based on GaN/AlGaN p-i-n Photodiodes. Jpn. J. Appl. Phys, 39(Part 2, No. 5A), L387-L 389.

Redaelli, L., Mukhtarova, A., Valdueza-Felip, S., Ajay, A., Bougerol, C., Himwas, C., Faure-Vincent, J., Durand, C., Eymery, J., Monroy, E. (2014). Effect of the quantum well thickness on the performance of InGaN photovoltaic cells. Applied Physics Letters, 105(13), 131105. https://doi.org/10.1063/1.4896679.

Sang, L., Liao, M., Ikeda, N., Koide, Y., Sumiya, M. (2011). Enhanced performance of InGaN solar cell by using a super-thin AlN interlayer. Applied Physics Letters, 99(16), 161109. https://doi.org/10.1063/1.3654155.

Sheu, J. K., Yang, C. C., Tu, S. J., Chang, K. H., Lee, M. L., Lai, W. C., Peng, L. C. (2009). Demonstration of GaN-based solar cells with GaN/InGaN superlattice absorption layers. IEEE Electron Device Letters, 30(3), 225-227. https://doi.org/10.1109/LED.2008.2012275.

Vadiee, E., Fischer, A. M., Clinton, E. A., McFavilen, H., Patadia, A., Arena, C., Ponce, F. A., King, R. R., Honsberg, C. B., Doolittle, W. A. (2019). Evaluating the performance of InGaN/GaN multi-quantum-well solar cells operated at elevated temperatures via DC and small-signal AC analysis. Japanese Journal of Applied Physics, 58(10), 101003. https://doi.org/10.7567/1347-4065/ab3b66.

Valdueza-Felip, S., Mukhtarova, A., Pan, Q., Altamura, G., Grenet, L., Durand, C., Bougerol, C., Peyrade, D., Gonzalez-Posada, F., Eymery, J., Monroy, E. (2013). Photovoltaic response of InGaN/GaN multiple-quantum well solar cells. Japanese Journal of Applied Physics, 52(8 Part 2), 08JH05. https://doi.org/10.7567/JJAP.52.08JH05.

Watanabe, N., Mitsuhara, M., Yokoyama, H., Liang, J., Shigekawa, N. (2014). Influence of InGaN/GaN multiple quantum well structure on photovoltaic characteristics of solar cell. Japanese Journal of Applied Physics, 53(11), 112301. https://doi.org/10.7567/JJAP.53.112301.

Watanabe, N., Yokoyama, H., Shigekawa, N., Sugita, K. I., Yamamoto, A. (2012). Barrier thickness dependence of photovoltaic characteristics of InGaN/GaN multiple quantum well solar cells. Japanese Journal of Applied Physics, 51 (10S), 10ND10. https://doi.org/10.1143/JJAP.51.10ND10.

Wierer, J. J., Koleske, D. D., Lee, S. R. (2012). Influence of barrier thickness on the performance of InGaN/GaN multiple quantum well solar cells. Applied Physics Letters, 100(11), 11111. https://doi.org/10.1063/1.3695170.

Yang, C. C., Sheu, J. K., Liang, X. W., Huang, M. S., Lee, M. L., Chang, K. H., Tu, S. J., Huang, F. W., Lai, W. C. (2010). Enhancement of the conversion efficiency of GaN-based photovoltaic devices with AlGaN/InGaN absorption layers. Applied Physics Letters, 97(2), 021113. https://doi.org/10.1063/1.3463469.

Yang, J., Zhao, D. G., Jiang, D. S., Chen, P., Zhu, J. J., Liu, Z. S., Le, L. C., He, X. G., Li, X. J., Yang, H., Zhang, Y. T., Du, G. T. (2015). Photovoltaic response of InGaN/GaN multi-quantum well solar cells enhanced by inserting thin GaN cap layers. Journal of Alloys and Compounds, 635, 82-86. https://doi.org/10.1016/j.jallcom.2015.02.052.

Young, N. G., Farrell, R. M., Hu, Y. L., Terao, Y., Iza, M., Keller, S., Denbaars, S. P., Nakamura, S., Speck, J. S. (2013). High performance thin quantum barrier InGaN/GaN solar cells on sapphire and bulk (0001) GaN substrates. Applied Physics Letters, 103(17), 173903. https://doi.org/10.1063/1.4826483.

Young, N. G., Perl, E. E., Farrell, R. M., Iza, M., Keller, S., Bowers, J. E., Nakamura, S., Denbaars, S. P., Speck, J. S. (2014). High-performance broadband optical coatings on InGaN/GaN solar cells for multijunction device integration. Applied Physics Letters, 104(16), 163902. https://doi.org/10.1063/1.4873117.

Young, N. G. (2015). Improving Efficiency of III-N Quantum Well Based Optoelectronic Devices through Active Region Design and Growth Techniques. University of California Santa Barbara.

Zhang, X. Bin, Wang, X. L., Xiao, H. L., Yang, C. B., Hou, Q. F., Yin, H. B., Chen, H., Wang, Z. G. (2011). InGaN/GaN multiple quantum well solar cells with an enhanced open-circuit voltage. Chinese Physics B, 20(2), 028402. https://doi.org/10.1088/1674-1056/20/2/028402.

Zhang, Y., Kappers, M. J., Zhu, D., Oehler, F., Gao, F., Humphreys, C. J. (2013). The effect of dislocations on the efficiency of InGaN/GaN solar cells. Solar Energy Materials and Solar Cells, 117, 279-284. https://doi.org/10.1016/j.solmat.2013.06.022.

Zheng, X., Horng, R. H., Wuu, D. S., Chu, M. T., Liao, W. Y., Wu, M. H., Lin, R. M., Lu, Y. C. (2008). High-quality InGaN/GaN heterojunctions and their photovoltaic effects. Applied Physics Letters, 93(26), 261108. https://doi.org/10.1063/1.3056628.

International Search Report dated Oct. 18, 2021, Application No. PCT/US2021/013760.

Non-Final Office Action for U.S. Appl. No. 17/151,110 dated Mar. 17, 2022.

Non-Final Office Action for U.S. Appl. No. 17/151,109 dated Apr. 11, 2022.

\* cited by examiner

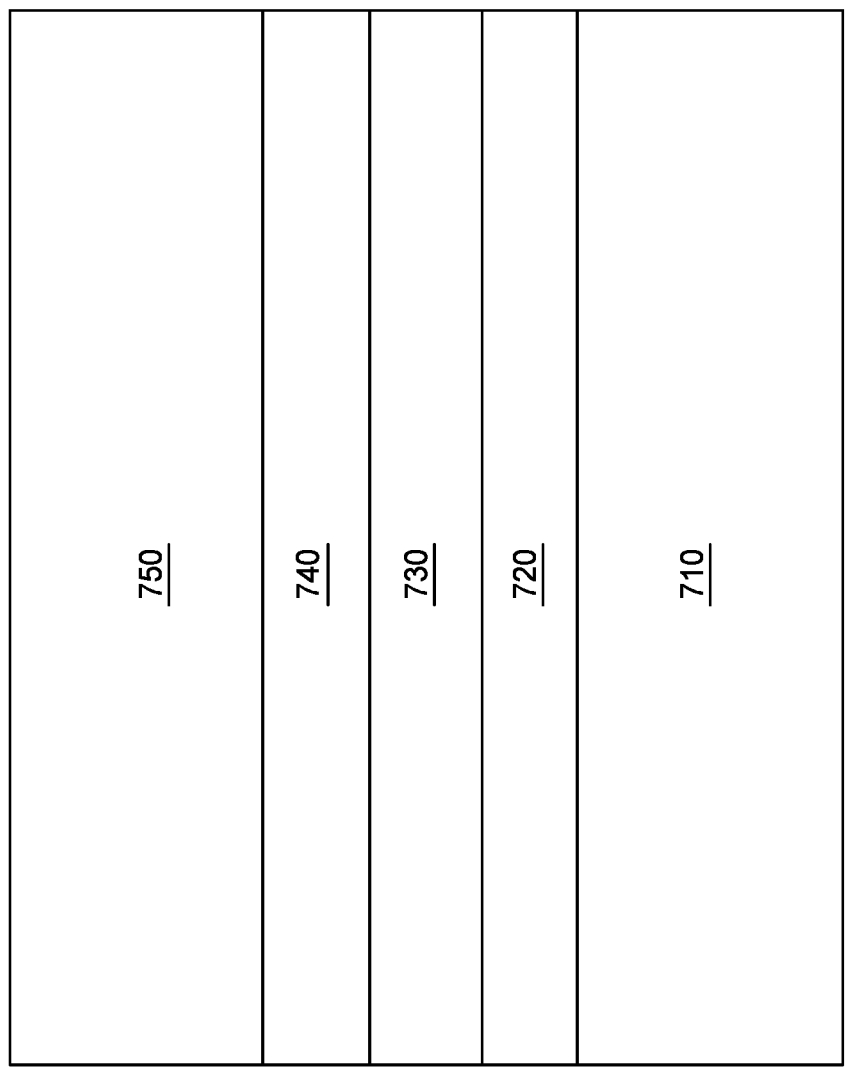

| Crystallographic orientation | N-type doping layer doping (cm⁻³) | N-type cladding layer % In | N-type cladding layer thickness (nm) | N-type cladding layer doping (cm⁻³) | Absorber Layer % In | P-type cladding layer % In | P-type cladding layer thickness (nm) | P-type cladding layer doping (cm⁻³) | P-type doping layer doping (cm⁻³) | Fill factor % | $V_{oc}$ (V) |
|---|---|---|---|---|---|---|---|---|---|---|---|
| (0001) | 2.00E+19 | | | | 18 | | | | 2.00E+19 | 6 | 2.53 |
| (0001) | 1.50E+19 | | | | 18 | | | | 6.00E+20 | 18 | 2.52 |
| (0001) | 1.50E+19 | 8 | 3 | 1.50E+19 | 18 | | | | 6.00E+20 | 86 | 2.45 |
| (0001) | 3.50E+19 | | | | 18 | | | | 5.00E+19 | 63 | 2.53 |
| (0001) | 3.50E+19 | | | | 18 | | | | 6.00E+19 | 69 | 2.53 |
| (0001) | 3.50E+19 | | | | 18 | | | | 8.00E+19 | 76 | 2.53 |
| (0001) | 3.50E+19 | | | | 18 | | | | 1.20E+20 | 84 | 2.53 |
| (0001) | 3.50E+19 | | | | 18 | | | | 2.00E+20 | 89 | 2.53 |
| (0001) | 3.50E+19 | | | | 18 | | | | 4.00E+20 | 92 | 2.53 |
| (0001) | 3.50E+19 | | | | 18 | | | | 6.00E+20 | 92 | 2.53 |
| (0001) | 4.50E+19 | | | | 18 | | | | 1.20E+20 | 85 | 2.53 |
| (0001) | 4.50E+19 | | | | 18 | | | | 2.00E+20 | 91 | 2.53 |
| (0001) | 2.00E+19 | | | | 12 | | | | 8.00E+18 | 49 | 2.78 |
| (0001) | 2.00E+19 | | | | 12 | | | | 1.30E+19 | 69 | 2.78 |
| (0001) | 2.00E+19 | | | | 12 | | | | 2.00E+19 | 80 | 2.78 |
| (0001) | 2.00E+19 | | | | 12 | | | | 1.00E+20 | 93 | 2.78 |
| (0001) | 2.00E+19 | | | | 12 | 0 | 10 | 5.00E+18 | 8.00E+18 | 28 | 2.77 |
| (0001) | 2.00E+19 | | | | 12 | 0 | 10 | 5.00E+18 | 2.00E+19 | 38 | 2.77 |
| (0001) | 2.00E+19 | | | | 12 | 0 | 3 | 5.00E+18 | 2.00E+19 | 66 | 2.78 |
| (0001) | 2.00E+19 | | | | 12 | 0 | 3 | 5.00E+18 | 1.00E+20 | 82 | 2.78 |
| (0001) | 2.00E+19 | | | | 12 | 6 | 3 | 5.00E+18 | 1.00E+20 | 93 | 2.78 |
| (0001) | 2.00E+19 | 0 | 3 | 5.00E+18 | 12 | 6 | 3 | 5.00E+18 | 1.00E+20 | 81 | 2.78 |
| (0001) | 2.00E+19 | 6 | 3 | 5.00E+18 | 12 | 6 | 3 | 5.00E+18 | 1.00E+20 | 90 | 2.74 |
| (0001) | 1.50E+16 | 0→18 | 10 | 1.50E+16 | 18 | | | | 2.00E+20 | 16 | 2.44 |
| (0001) | 1.50E+17 | 0→18 | 10 | 1.50E+17 | 18 | | | | 2.00E+20 | 83 | 2.44 |
| (0001) | 1.50E+18 | 0→18 | 10 | 1.50E+18 | 18 | | | | 2.00E+20 | 86 | 2.45 |
| (0001) | 1.50E+17 | 0→18 | 5 | 1.50E+17 | 18 | | | | 2.00E+20 | 16 | 2.52 |
| (0001) | 1.50E+18 | 0→18 | 5 | 1.50E+18 | 18 | | | | 2.00E+20 | 86 | 2.45 |
| (0001) | 1.50E+18 | 0→18 | 5 | 1.50E+18 | 18 | | | | 5.00E+19 | 58 | 2.47 |
| (0001) | 1.50E+18 | 0→18 | 5 | 1.50E+18 | 18 | 0→18 | 5 | 5.00E+19 | 5.00E+19 | 89 | 2.45 |
| (000-1) | 1.00E+18 | | | | 12 | | | | 1.00E+18 | 94 | 2.78 |
| (000-1) | 1.00E+16 | | | | 18 | | | | 1.00E+16 | 93 | 2.53 |
| (000-1) | 1.00E+17 | | | | 18 | | | | 1.00E+17 | 94 | 2.53 |
| (000-1) | 1.00E+18 | | | | 18 | | | | 1.00E+18 | 94 | 2.53 |
| (10-10) | 4.00E+18 | | | | 18 | | | | 4.00E+18 | 58 | 2.53 |
| (10-10) | 8.00E+18 | | | | 18 | | | | 8.00E+18 | 78 | 2.53 |
| (10-10) | 1.20E+19 | | | | 18 | | | | 1.20E+19 | 84 | 2.53 |
| (10-10) | 2.00E+19 | | | | 18 | | | | 2.00E+19 | 90 | 2.53 |
| (10-10) | 2.00E+19 | | | | 12 | | | | 2.00E+19 | 94 | 2.78 |
| (30-3-1) | 1.00E+18 | | | | 12 | | | | 1.00E+18 | 94 | 2.78 |
| (30-3-1) | 1.00E+18 | | | | 18 | | | | 1.00E+18 | 57 | 2.53 |
| (30-3-1) | 8.00E+18 | | | | 18 | | | | 8.00E+18 | 89 | 2.53 |
| (30-3-1) | 1.20E+19 | | | | 18 | | | | 1.20E+19 | 91 | 2.53 |

FIG. 15

POWER PHOTODIODE STRUCTURES, METHODS OF MAKING, AND METHODS OF USE

CROSS-REFERENCE TO RELATED APPLICATIONS

This application claims benefit to U.S. provisional applications No. 62/874,487, filed Jul. 15, 2019, and No. 62/978,281, filed Feb. 18, 2020, each of which is incorporated by reference herein.

BACKGROUND

Field

This disclosure relates generally to techniques for transmitting power through optical fibers and, in particular, to techniques for high current density power photodiode structures and devices fabricated on bulk gallium and nitrogen containing polar, semipolar or nonpolar materials. The invention can be applied to applications involving conversion of light energy to electrical energy, particularly via optical fibers, other optoelectronic devices, and similar products.

Description of the Related Art

Electrical power is typically transmitted over a wire, for example, a copper wire. However, such wires can be heavy, cumbersome, and expensive, and the transmitted power can be subject to electromagnetic interference. Some of these limitations can be overcome by transmitting power over an optical fiber but, unfortunately, with current capability such approaches are not yet commercially viable. In addition, current approaches generally involve light at infrared wavelengths, which has certain disadvantages over visible light, such as greater sensitivity to temperature variations in the surrounding environment.

Gallium nitride (GaN) based optoelectronic and electronic devices are of tremendous commercial importance. The best-developed of these devices include light emitting diodes (LEDs) and laser diodes, and GaN-based power diodes and transistors are becoming increasingly important. There is also interest in emerging applications. De Santi, and coauthors [Materials 11, 153 (2018)] described an application whereby electrical power is converted to optical power using a laser diode, the optical power is coupled to an optical fiber and transmitted to a remote location, then the optical power is converted back to electrical power using a photodiode. Both the laser diode and the photodiode were based on GaN-on-sapphire devices and the system performance was relatively poor. The photodiode was a particular challenge, with a reported efficiency of 17%. GaN-based solar cells have also been reported by a number of groups, typically utilizing GaN-on-sapphire structures for low power (ca. one sun) applications. Even concentrator solar cell structures, which are well known in the art for other materials systems, are only able to generate substantially lower current densities than those that are the principal focus of the current invention.

In the case of laser diodes, it is well known that superior performance and reliability can be obtained in GaN-on-GaN devices, which have greatly reduced defect densities and have undergone many years of optimization and improvement. In the case of photodiodes, considerably less work has been done. For example, D'Evelyn et al. [U.S. Pat. No. 6,806,508] disclosed a GaN-on-GaN photodiode, but the detailed performance characteristics were not reported and the device was intended for photodetector applications rather than for power diode applications involving optical fiber.

Related applications have been disclosed using GaAs-based lasers and photodiodes, at wavelengths in the near-infrared. However, due to its larger bandgap, photodiodes based on the nitrides should enable considerably higher open-circuit voltages and superior efficiencies at elevated temperatures and at high input power levels, relative to corresponding GaAs-based devices and systems.

From the above, it is seen that techniques for improving GaN-based power photodiodes are highly desirable.

SUMMARY

Embodiments of the disclosure may provide a photodiode structure, including a substrate having a first surface and a second surface, wherein the second surface of the substrate is opposite to the first surface, the substrate is a single-crystalline group-III metal nitride, and the first surface of the substrate has a crystallographic orientation within 5 degrees of (0001) +c-plane, {10-10} m-plane, or a semipolar plane selected from one of {11-2±2}, {60-6±1}, {50-5±1}, {40-4±1}, {30-3±1}, {50-5±2}, {70-7±3}, {20-2±1}, {30-3±2}, {40-4±3}, {50-5±4}, {10-1±1}, {1 0–1±2}, {50–5±4}, or differs from (000-1) by between 2 degrees and 5 degrees. The photodiode structure also includes an n-type layer and a p-type layer that are disposed over the first surface of the substrate, wherein the n-type layer and the p-type layer each comprise $Al_xIn_yGa_{1-x-y}N$, where $0 \leq x, y, x+y \leq 1$, and have a dopant concentration of at least $1 \times 10^{17}$ cm$^{-3}$, one or more absorber layers disposed between the n-type and the p-type layers, wherein the one or more absorber layers comprise $Al_xIn_yGa_{1-x-y}N$, where $0 \leq x, y, x+y \leq 1$ and have a dislocation density below about $10^9$ cm$^{-2}$, a p-side electrical contact layer disposed over the p-type layer, wherein the p-side electrical contact layer has an average reflectance of at least 70% for at least one wavelength between 390 nanometers and 460 nanometers and a contact resistance below $3 \times 10^{-3}$ $\Omega$cm$^2$; an n-side electrical contact layer disposed over the second surface of the substrate, wherein the n-side electrical contact layer has an average reflectance of at least 70% for at least one wavelength between 390 nanometers and 460 nanometers and a contact resistance below $1 \times 10^{-3}$ $\Omega$cm$^2$; and a light receiving surface, wherein the light receiving surface is aligned to cause light, having at least one wavelength between 390 nanometers and 460 nanometers and incident on the light receiving surface at an angle, to be reflected at least once from the n-side electrical contact layer and from the p-side electrical contact layer. The photodiode structure may also be characterized by a fill factor of at least 50% under an illumination level producing a current density of at least 10 A cm$^{-2}$.

Embodiments of the disclosure may further provide a photodiode structure, including one or more absorber layers, wherein the one or more absorber layers comprise $Al_xIn_yGa_{1-x-y}N$, where $0 \leq x, y, x+y \leq 1$, an n-type layer and a p-type layer, wherein the one or more absorber layers being disposed over the n-type layer and the p-type layer being disposed over the one or more absorber layers, a carrier substrate having a first surface and a second surface, wherein the first surface of the carrier substrate being disposed over the p-type layer or under the n-type layer, a p-side electrical contact layer placed in electrical contact with the p-type layer, wherein the p-side electrical contact layer has a contact resistance below $3 \times 10^{-3}$ $\Omega cm^2$, a p-side reflector layer disposed on one of the p-type layer and the second surface of the carrier substrate, the p-side reflector layer having an average reflectance of at least 70% for at least one wavelength between 390 nanometers and 460 nanometers, an n-side electrical contact layer placed in electrical contact with the n-type layer, wherein the n-side electrical contact layer has a contact resistance below $1 \times 10^{-3}$ $\Omega cm^2$, an n-side reflector layer disposed over one of the n-side layer and the second surface of the carrier substrate, the n-side reflector layer having an average reflectance of at least 70% for at least one wavelength between 390 nanometers and 460 nanometers, and a light receiving surface, wherein the light receiving surface is aligned to cause light, having at least one wavelength between 390 nanometers and 460 nanometers and incident on the light receiving surface at an angle, to be reflected at least once from the n-side reflector layer and from the p-side reflector layer. The n-type layer and the p-type layer each comprise $Al_xIn_yGa_{1-x-y}N$, where $0 \leq x, y, x+y \leq 1$, and have a dopant concentration of at least $1 \times 10^{16}$ $cm^{-3}$. The carrier substrate being substantially transparent at wavelengths between 390 nanometers and 460 nanometers.

Embodiments of the disclosure may further provide a photodiode structure, including a substrate having a first surface, a second surface and a third surface, an n-type layer and a p-type layer that are disposed over the first surface of the substrate, one or more absorber layers disposed between the n-type and the p-type layers, a p-type electrode layer disposed over the p-type layer, an n-type electrode layer disposed over the second surface of the substrate, and a light receiving surface, wherein the third surface comprises the light receiving surface and is configured to cause light received therethrough to be reflected at least once between the n-type electrode layer and the p-type electrode layer. The n-type electrode layer includes an array of openings formed therein, and has an average reflectance of at least 70% at wavelengths between 390 nanometers and 460 nanometers. The p-type electrode layer includes an array of openings formed therein, and has an average reflectance of at least 70% at wavelengths between 390 nanometers and 460 nanometers. The one or more absorber layers include an $Al_xIn_yGa_{1-x-y}N$ material, where $0 \leq x, y, x+y \leq 1$ and have a dislocation density below about $10^9$ $cm^{-2}$. The n-type layer and the p-type layer each include an $Al_xIn_yGa_{1-x-y}N$ material, where $0 \leq x, y, x+y \leq 1$; and have a dopant concentration of at least $1 \times 10^{16}$ $cm^{-3}$. The second surface of the substrate is opposite to the first surface, the third surface of the substrate is aligned at an angle to the first and second surfaces, the substrate is a single-crystalline group-III metal nitride, and the first surface of the substrate has a crystallographic orientation within 5 degrees of (0001) +c-plane, {10-10} m-plane, or a semipolar plane selected from one of {11-2±2}, {60-6±1}, {50-5±1}, {40-4±1}, {30-3±1}, {50-5±2}, {70-7±3}, {20-2±1}, {30-3±2}, {40-4±3}, {50-5±4}, {1 0 −1±1}, {1 0 −1±2}, {50-5±4}, or differs from (000-1) by between 2 degrees and 5 degrees.

Embodiments of the disclosure may include a photodiode structure, comprising one or more absorber layers lying between n-type and p-type layers, each of the absorber and n-type and p-type layers comprising $Al_xIn_yGa_{1-x-y}N$, where $0 \leq x, y, x+y \leq 1$ and having a dislocation density below about $10^9$ $cm^{-2}$, each of the n-type and p-type non-absorber layers being characterized by a dopant concentration of at least $1 \times 10^{16}$ $cm^{-3}$, wherein the absorber layer is configured for efficient power conversion of light having a wavelength between about 390 nanometers and 460 nanometers; and the structure is characterized by a fill factor of at least 50% under an illumination level producing a current density of at least 10 A $cm^{-2}$.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 7 is a simplified diagram showing a schematic illustration of semiconductor layers within a photodiode structure according to an embodiment of the current disclosure.

FIG. 15 includes a table of the illuminated I-V performance characteristics of InGaN/GaN photodiode structures according to one or more embodiments of the present disclosure.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
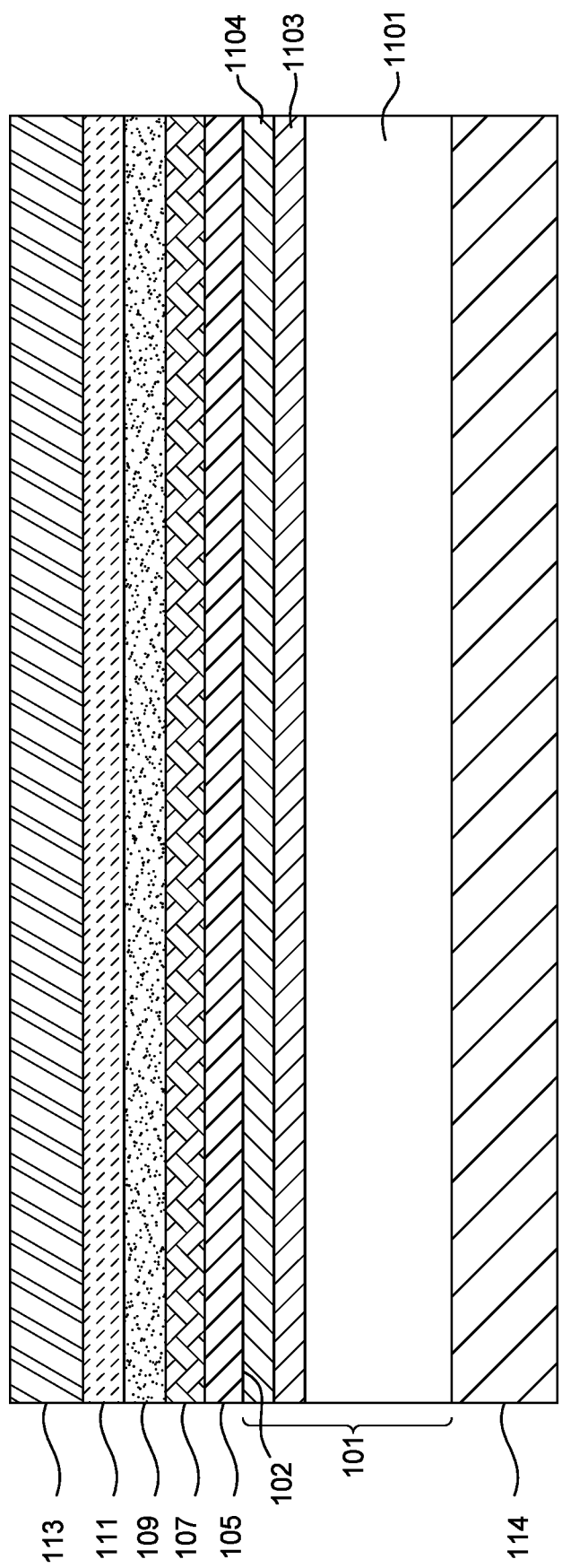
FIG. 1 is a simplified diagram illustrating a nitride-based power photodiode structure that has been prepared according to an embodiment of the present disclosure.

According to the present disclosure, techniques related to manufacturing and applications of power photodiode structures and devices based on group-III metal nitride and gallium-based substrates are provided. More specifically, embodiments of the disclosure include techniques for fabricating photodiode devices comprising one or more of GaN, AlN, InN, InGaN, AlGaN, and AlInGaN, structures and devices. Such structures or devices can be used for a variety of applications including optoelectronic devices, photodiodes, power-over-fiber receivers, and others.

As noted previously, lasers and photodiodes are better developed in the GaAs material system. One of the key differences in materials properties between the arsenide and nitride systems is that the bandgap may be varied readily with minimal impact on lattice constant in the case of the arsenides, e.g., via AlGaAs, but not in the case of the nitrides. Traditional photodiode package architectures incorporating nitride absorber layers may require an absorber layer thickness on the order of several hundred nanometers to absorb the large majority of the incident light. Assuming an absorber layer absorption coefficient of $1 \times 10^5$ cm$^{-1}$, the light absorbed in a single pass is approximately 39%, 63%, 87%, 95%, and 98% for thicknesses of 50, 100, 200, 300, and 400 nm, respectively. In the case of the nitrides, such a thickness of InGaN, with sufficient indium (In) to efficiently absorb blue or violet light, may be too strained to avoid relaxation by dislocation generation or by cracking. The inventors have discovered an approach to circumvent this problem, involving long optical paths through an absorber layer to achieve near-100% optical absorption even with a relatively thin absorber layer. Additional benefits include excellent heat dissipation, zero or very low grid shadow losses, and long effective minority carrier lifetimes. Here, the effective minority carrier lifetime includes photon recycling, defined as reabsorption of photons emitted by the absorber layer.

In addition, photodiode structures, such as a stack of epitaxially-grown layers, have both similarities and differences to structures for light-emitting diodes (LEDs) and laser diodes (LDs). For example, both LED and LD structures commonly include electron blocking layers within a p-type layer, to minimize electron loss from the active region and promote radiative carrier recombination within the active region. However, such structures may increase the series resistance for photodiode structures and may be counter-productive. Similarly, LD structures commonly include one or more of cladding layers, optical confinement layers, and separate confinement heterostructure (SCH) layers that may detract from the performance of the photodiodes, as their design is driven by different considerations than the present application.

For purposes of designing effective epitaxial structures for a photodiode, both in general and for the specific case where the active layer includes or consists of InGaN or Ga(In)N, high levels of active layer optical absorption and of the collection efficiency for minority carriers will increase the detection sensitivity and the operating current, $I_{mp}$. Low concentrations of defects, both point defects and extended defects, such as dislocations and stacking faults, will reduce Shockley-Read-Hall nonradiative recombination and thereby result in higher operating voltages $V_{mp}$. Low concentrations of defects may also enable improved photodiode performance under high light conditions (i.e., high optical power (Watts) conditions). The efficiency η of a photodiode may be written as $\eta = V_{mp} \times I_{mp} / P_{in}$, where $P_{in}$ is the input radiative power.

Figure 4:
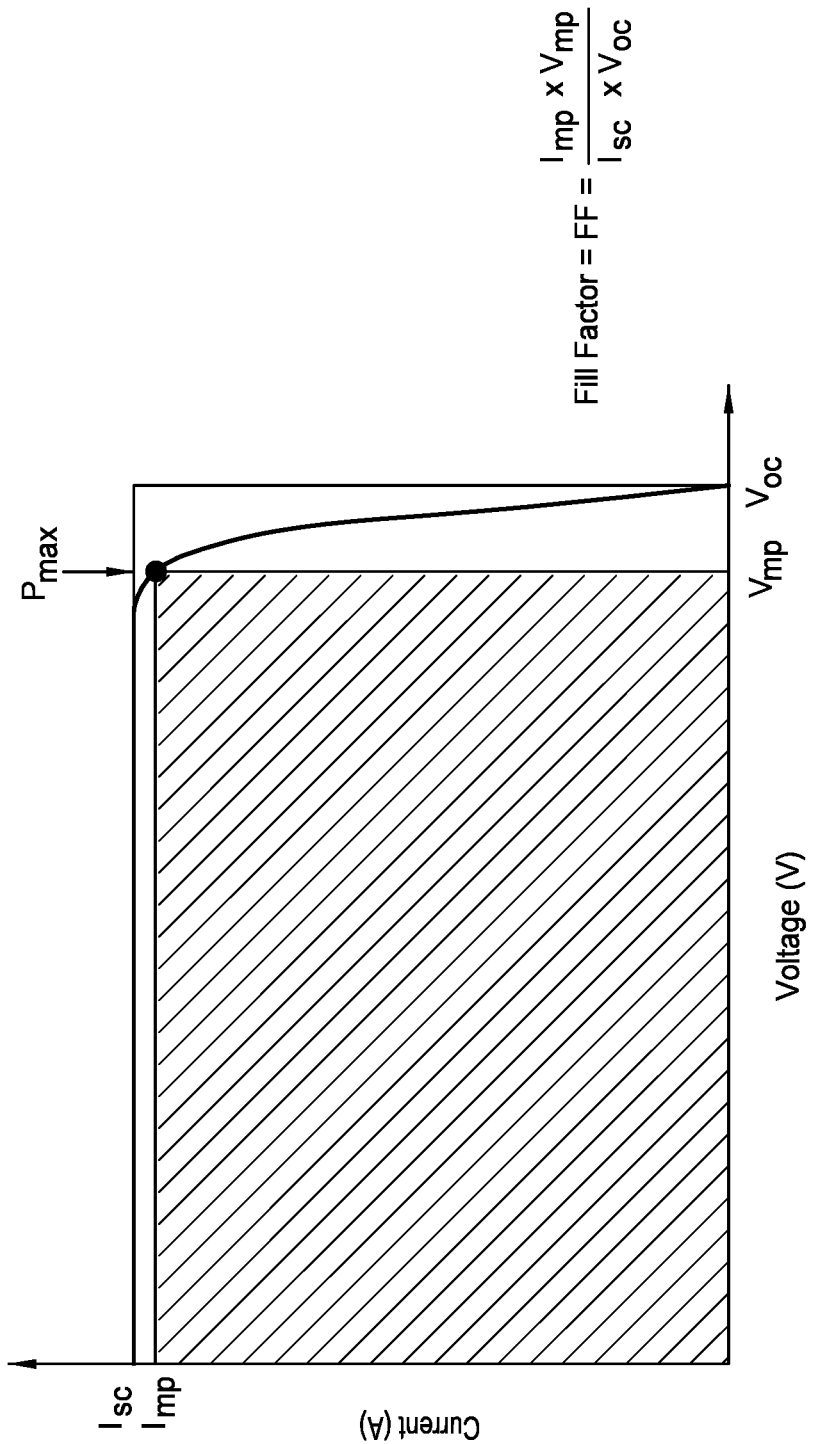
FIG. 4 is a simplified diagram illustrating the definition of the fill factor for a photodiode according to an embodiment of the present disclosure.

Another way of expressing the efficiency η of a photodiode is $\eta = V_{oc} \times I_{sc} \times FF / P_{in}$, as illustrated schematically in FIG. 4, where $V_{oc}$ is the open-circuit voltage, $I_{sc}$ is the short-circuit current, and FF is the fill factor. Still another way of expressing the efficiency η of a semiconductor photodiode is $\eta = (eV_{oc}/E_g) \times OA \times IQE \times FF \times E_g/(hv)$, where e is the charge of an electron, $E_g$ is the band gap of the semiconductor, OA is the optical absorption (or fraction of incident photons absorbed in the absorber layer), IQE is the internal quantum efficiency (fraction of absorbed photons producing an electron-hole pair that is collected), h is Planck's constant, and v is the photon energy. In preferred embodiments, the FF is greater than 50%, greater than 60%, greater than 70%, greater than 80%, or greater than 90%.

Figure 2:
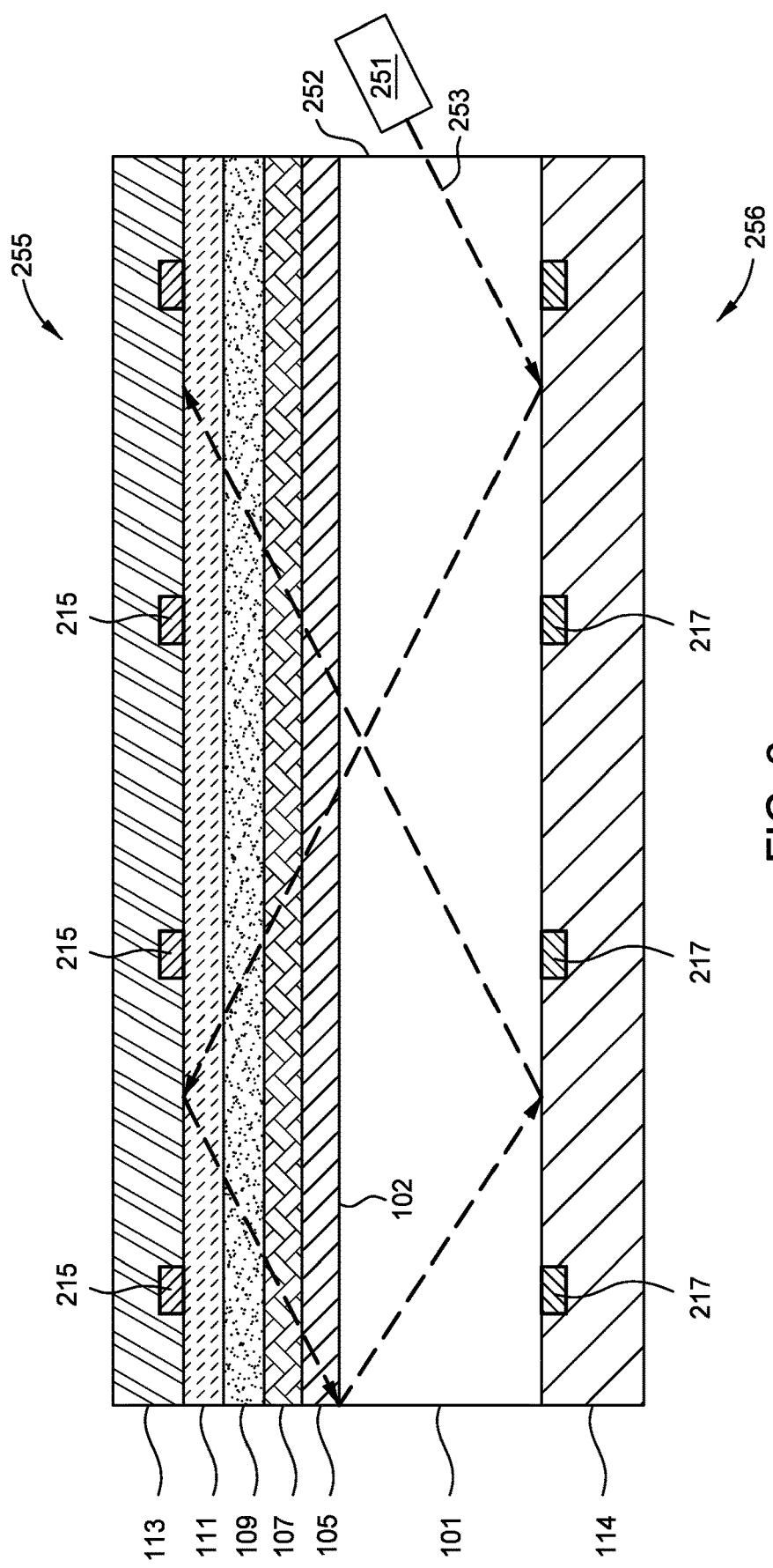
FIG. 2 is a simplified diagram illustrating an alternative nitride-based power photodiode structure that has been prepared according to an embodiment of the present disclosure.

Relative to prior art photodiodes designed for much lower photon fluxes, mostly fabricated using GaN-on-sapphire structures, the inventive photodiodes, including GaN-on-GaN structures, feature high conversion efficiency due to careful optimization of the composition and doping of the semiconductor layers and to large area p-side and n-side electrical contacts with high reflectivity for use with a many-reflection excitation architecture and with very low contact resistance to minimize lateral ohmic losses at high current densities. In certain embodiments, the current photodiode structures are designed for applications where illumination is provided by a single laser or multiple lasers and enters the structure though an edge or through an aperture, as schematically illustrated in FIG. 2. In certain embodiments, the laser light is coupled into an edge of the photodiode structure or into an aperture formed in the photodiode structure using optical fibers, lenses, or waveguides. In certain embodiments, the inventive photodiode structures further incorporate a much lower dislocation density, with longer minority carrier diffusion lengths for higher current plus longer minority carrier lifetimes for higher open circuit voltage and fill factor. In addition, the inventive devices may include electrically conductive substrates, enabling vertical transport in vertically oriented power devices for a simpler design and reduced series resistance, and transparent substrates with a very similar refractive index of that of the absorber layers, minimizing optical losses. In certain embodiments, the substrate has a nonpolar or semipolar crystallographic orientation, enabling tuning of polarization fields for optimum device performance.

Figure 3:
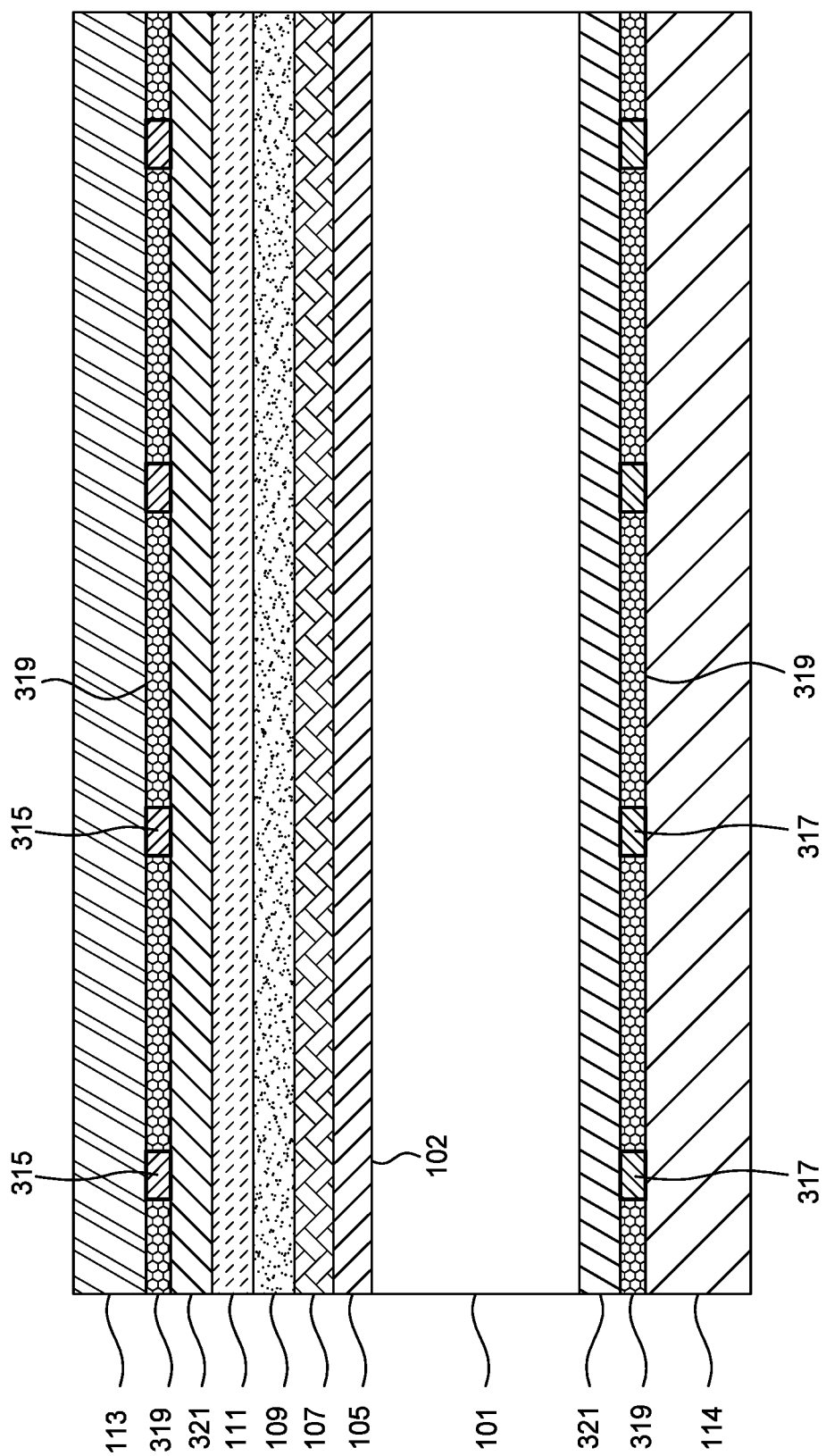
FIG. 3 is a simplified diagram illustrating another alternative nitride-based power photodiode structure that has been prepared according to an embodiment of the present disclosure.

FIGS. 1-3 depict simplified diagrams of group III-metal nitride based photodiode structures. Referring to FIG. 1, a substrate 101 is provided. In certain embodiments, substrate 101 comprises single-crystalline group-III metal nitride, gallium-containing nitride, or gallium nitride. Substrate 101 may be grown by HVPE, ammonothermally, or by a flux method. In certain embodiments, substrate 101 is a template, where a single-crystalline group-III metal nitride layer 1104 has been deposited or grown on a template substrate 1101 that consists of or includes a material such as sapphire ($Al_2O_3$), silicon carbide (SiC), or silicon. In alternative embodiments, template substrate 1101 may consist of or include gallium arsenide, germanium, a silicon-germanium alloy, $MgAl_2O_4$ spinel, ZnO, $ZrB_2$, BP, InP, AlON, $ScAlMgO_4$, $YFeZnO_4$, MgO, $Fe_2NiO_4$, $LiGa_5O_8$, $Na_2MoO_4$, $Na_2WO_4$, $In_2CdO_4$, lithium aluminate ($LiAlO_2$), $LiGaO_2$, $Ca_8La_2(PO_4)_6O_2$, gallium nitride (GaN), aluminum nitride (AlN), or the like. One or both large area surfaces of substrate 101 may be polished and/or chemical-mechanically polished. A large-area surface 102 of substrate 101 may have a crystallographic orientation within 5 degrees, within 2 degrees, within 1 degree, or within 0.5 degree of (0001) +c-plane, (000-1) −c-plane, {10-10} m-plane, {11-2±2}, {60-6±1}, {50-5±1}, {40-4±1}, {30-3±1}, {50-5±2}, {70-7±3}, {20-2±1}, {30-3±2}, {40-4±3}, {50-5±4}, {10-1±1}, {1 0 −1 ±2}, {1 0 −1 ±3}, {2 1 −3 ±1}, or {3 0 −3 ±4}. It will be understood that plane {3 0 −3 ±4} means the {3 0 −3 4} plane and the {3 0 −3 −4} plane. Surface 102 may have an (h k i l) semipolar orientation, where i=−(h+k) and l and at least one of h and k are nonzero. In certain embodiments, template substrate 1101 consists of or includes sapphire and has a large-area surface that has a crystallographic orientation within 5 degrees, within 2 degrees, within 1 degree, or within 0.5 degree of (0001), (10-10), (10-12), (22-43), or (11-23). In certain embodiments, template substrate 1101 consists of or includes sapphire and has a large-area surface that is misoriented from (0001) by an angle between about 0.5 degree and about 8 degrees, or between about 2 degrees and about 4 degrees, toward the {11-20} a-plane, toward the {10-10} m-plane, or toward a-plane intermediate between a-plane and m-plane. In certain embodiments, template substrate 1101 has a cubic structure and a large-area surface that has a crystallographic orientation within 5 degrees, within 2 degrees, within 1 degree, or within 0.5 degree of {111}, {100}, {110}, or {114}. Other orientations may also be chosen.

Surface 102 may have a maximum dimension between about 0.2 millimeter and about 600 millimeters and a minimum dimension between about 0.2 millimeter and about 600 millimeters and substrate 101 may have a thickness between about 10 micrometers and about 10 millimeters, or between about 100 micrometers and about 2 millimeters. In certain embodiments, substrate 101 is substantially circular, with one or more orientation flats. In alternative embodiments, substrate 101 is substantially rectangular. In certain embodiments, large-area surface 102 has a maximum dimension of about 50 mm, 100 mm, 125 mm, 150 mm, 200 mm, 250 mm, or 300 mm. The variation in the crystallographic orientation of the large-area surface 102 may be less than about 5 degrees, less than about 2 degrees, less than about 1 degree, less than about 0.5 degree, less than about 0.2 degree, less than about 0.1 degree, or less than about 0.05 degree.

Substrate 101 may have a surface threading dislocation density less than about $10^7$ $cm^{-2}$, less than about $10^6$ $cm^{-2}$, less than about $10^5$ $cm^{-2}$, less than about $10^4$ $cm^{-2}$, less than about $10^3$ $cm^{-2}$, or less than about $10^2$ $cm^{-2}$. Substrate 101 may have a stacking-fault concentration below about $10^4$ $cm^{-1}$, below about $10^3$ $cm^{-1}$, below about $10^2$ $cm^{-1}$, below about 10 $cm^{-1}$ or below about 1 $cm^{-1}$. Substrate 101 may have a symmetric x-ray rocking curve full width at half maximum (FWHM) less than about 500 arcsec, less than about 300 arcsec, less than about 200 arcsec, less than about 100 arcsec, less than about 50 arcsec, less than about 35 arcsec, less than about 25 arcsec, or less than about 15 arcsec. Substrate 101 may have a crystallographic radius of curvature greater than 0.1 meter, greater than 1 meter, greater than 10 meters, greater than 100 meters, or greater than 1000 meters, in at least one or at least two independent or orthogonal directions. In a specific embodiment, substrate 101 has a surface threading dislocation density less than about $10^5$ $cm^{-2}$, a stacking-fault concentration below about 10 $cm^{-1}$, and a symmetric x-ray rocking curve full width at half maximum (FWHM) less than about 50 arcsec. The reduced dislocation density in the substrate, relative to most prior art photodiodes, is expected to result in a reduced dislocation density in the semiconductor layers of the photodiode and to a higher open-circuit voltage $V_{oc}$ and a higher efficiency at high current densities.

In some embodiments, the substrate 101 may include regions having a relatively high concentration of threading dislocations separated by regions having a relatively low concentration of threading dislocations. The concentration of threading dislocations in the relatively high concentration regions may be greater than about $10^5$ $cm^{-2}$, greater than about $10^6$ $cm^{-2}$, greater than about $10^7$ $cm^{-2}$, or greater than about $10^8$ $cm^{-2}$. The concentration of threading dislocations in the relatively low concentration regions may be less than about $10^6$ $cm^{-2}$, less than about $10^5$ $cm^{-2}$, or less than about $10^4$ $cm^{-2}$. Substrate 101 may also or separately include regions having a relatively high electrical conductivity separated by regions having a relatively low electrical conductivity. Substrate 101 may have a thickness between about 10 microns and about 100 millimeters, or between about 0.1 millimeter and about 10 millimeters. Substrate 101 may have a dimension, including a diameter, of at least about 5 millimeters, at least about 10 millimeters, at least about 25 millimeters, at least about 50 millimeters, at least about 75 millimeters, at least about 100 millimeters, at least about 150 millimeters, at least about 200 millimeters, at least about 300 millimeters, at least about 400 millimeters, or at least about 600 millimeters. In a specific embodiment, substrate 101 has a thickness between about 250 micrometers and about 600 micrometers, a maximum lateral dimension or diameter between about 15 millimeters and about 160 millimeters, and includes regions where the concentration of threading dislocations is less than about $10^4$ $cm^{-2}$.

Substrate 101 may comprise a release layer 1103 for facile separation of a surface layer 1104 from the balance of the substrate, such as a template substrate 1101. In some embodiments, the release layer 1103 has an optical absorption coefficient greater than 1000 $cm^{-1}$ at at least one wavelength where the template substrate is substantially transparent, with an optical absorption coefficient less than 50 $cm^{-1}$, thereby enabling substrate removal by a laser lift-off technique, for example, after fabrication of at least one device structure. In certain embodiments, release layer 1103 includes or consists of GaN that is heavily doped with Co, increasing its optical absorption coefficient to greater than 5000 $cm^{-1}$ over the entire visible spectrum. In one specific embodiment, Co-doped release layer 1103 having a thickness between 0.5 micrometer and 50 micrometers is formed ammonothermally on template substrate 1101, with $CoF_2$ as an additive to the mineralizer and template 1101 consisting of a high quality GaN seed crystal. In another specific embodiment, Co-doped release layer 1103 is formed by MOCVD on a high quality GaN substrate 1101, using at least one of cyclopentadienylcobalt dicarbonyl (($C_5H_5$)Co$(CO)_2$), cobalt (II) acetylacetonate ($Co(CH_3C(O)CHC(O)CH_3)_2$), cobalt tricarbonyl nitrosyl ($Co(CO)_3NO$), dicobalt octacarbonyl ($Co_2(CO)_8$), and tetracobalt dodecacarbonyl ($Co_4(CO)_{12}$) as a dopant precursor. In still another specific embodiment, Co-doped release layer 1103 is formed by hydride vapor phase epitaxy (HVPE) on a high quality GaN substrate 1101, using at least one of cyclopentadienylcobalt dicarbonyl (($C_5H_5$)Co(CO)$_2$), cobalt (II) acetylacetonate (Co(CH$_3$C(O)CHC(O)CH$_3$)$_2$), cobalt tricarbonyl nitrosyl (Co(CO)$_3$NO), dicobalt octacarbonyl (Co$_2$(CO)$_8$), and tetracobalt dodecacarbonyl (Co$_4$(CO)$_{12}$) as a dopant precursor. Further details are described in U.S. Pat. No. 8,148,801, which is hereby incorporated by reference in its entirety. In some embodiments, the release layer 1103 comprises InGaN and has a bandgap less than that of the absorber layer described below, thereby enabling substrate removal by a photoelectrochemical etching technique, for example, after fabrication of at least one device structure. In a specific embodiment, release layer 1103 includes or consists of a strained-layer superlattice of InGaN and GaN or AlGaN, where the percent (%) indium (In) in the strained-layer superlattice is greater than that in the absorber layer, and is grown by MOCVD on a high quality GaN substrate 1101. Further details of an InGaN release layer are described in more detail in U.S. Pat. No. 8,866,149 and in U. S. Patent Application publication no. US2019/0088495, each of which are hereby incorporated by reference in their entirety.

In certain embodiments, substrate 101 consists of a group III metal nitride layer 1104 bonded to or formed on a surface of a template substrate 1101. The group III metal nitride layer 1104 may include gallium. The group III metal nitride layer may be deposited by HVPE, by metalorganic chemical vapor deposition (MOCVD), molecular beam epitaxy (MBE), or the like. The group III metal nitride layer 1104 may have a thickness between about 1 micrometer and about 100 micrometers, between about 2 micrometers and about 25 micrometers, or between about 3 micrometers and about 15 micrometers. In certain embodiments, the group III metal nitride layer 1104 has a wurtzite crystal structure and a crystallographic orientation within 5 degrees, within 2 degrees, within 1 degree, or within 0.5 degree of (0001) +c-plane, (000-1)-c-plane, {10-10} m-plane, {11-2±2}, {60-6±1}, {50-5±1}, {40-4±1}, {30-3±1}, {50-5±2}, {70-7±3}, {20-2±1}, {30-3±2}, {40-4±3}, {50-5±4}, {10-1±1}, {1 0 −1 ±2}, {1 0 −1 ±3}, {2 1 −3 ±1}, or {3 0 −3 ±4}. In certain embodiments, a nucleation layer (not shown) is present at the interface between the template substrate 1101 and the group III metal nitride layer 1104. In certain embodiments, the nucleation layer consists of or includes one or more of aluminum nitride, gallium nitride, and zinc oxide. In certain embodiments, the nucleation layer is deposited on the template substrate 1101 by at least one of low-temperature MOCVD, sputtering, and electron-beam evaporation. In certain embodiments, the nucleation layer has a thickness between about 1 nanometer and about 200 nanometers or between about 10 nanometers and about 50 nanometers. In certain embodiments, the substrate further includes one or more strain-management layers, for example, an AlGaN layer or a strained-layer superlattice.

In certain embodiments, surface 102 has atomic impurity concentrations of at least one of oxygen (O), and hydrogen (H) above about $1\times10^{16}$ cm$^{-3}$, above about $1\times10^{17}$ cm$^{-3}$, or above about $1\times10^{18}$ cm$^{-3}$. In certain embodiments, a ratio of the atomic impurity concentration of H to the atomic impurity concentration of O is between about 1.1 and about 1000, or between about 5 and about 100. In certain embodiments, surface 102 has impurity concentrations of at least one of lithium (Li), sodium (Na), potassium (K), fluorine (F), chlorine (Cl), bromine (Br), or iodine (I) above about $1\times10^{15}$ cm$^{-3}$, above about $1\times10^{16}$ cm$^{-3}$, or above about $1\times10^{17}$ cm$^{-3}$, above about $1\times10^{18}$ cm$^{-3}$. In certain embodiments, surface 102 has impurity concentrations of O, H, carbon (C), Na, and K between about $1\times10^{16}$ cm$^{-3}$ and $1\times10^{19}$ cm$^{-3}$, between about $1\times10^{16}$ cm$^{-3}$ and $2\times10^{19}$ cm$^{-3}$, below $1\times10^{17}$ cm$^{-3}$, below $1\times10^{16}$ cm$^{-3}$, and below $1\times10^{16}$ cm$^{-3}$, respectively, as quantified by calibrated secondary ion mass spectrometry (SIMS). In another embodiment, surface 102 has impurity concentrations of O, H, C, and at least one of Na and K between about $1\times10^{16}$ cm$^{-3}$ and $1\times10^{19}$ cm$^{-3}$, between about $1\times10^{16}$ cm$^{-3}$ and $2\times10^{19}$ cm$^{-3}$, below $1\times10^{17}$ cm$^{-3}$, and between about $3\times10^{15}$ cm$^{-3}$ and $1\times10^{18}$ cm$^{-3}$, respectively, as quantified by calibrated secondary ion mass spectrometry (SIMS). In still another embodiment, surface 102 has impurity concentrations of O, H, C, and at least one of F and Cl between about $1\times10^{16}$ cm$^{-3}$ and $1\times10^{19}$ cm$^{-3}$, between about $1\times10^{16}$ cm$^{-3}$ and $2\times10^{19}$ cm$^{-3}$, below $1\times10^{17}$ cm$^{-3}$, and between about $1\times10^{15}$ cm$^{-3}$ and $1\times10^{19}$ cm$^{-3}$, respectively, as quantified by calibrated secondary ion mass spectrometry (SIMS). In some embodiments, surface 102 has impurity concentrations of H between about $5\times10^{17}$ cm$^{-3}$ and $1\times10^{19}$ cm$^{-3}$, as quantified by calibrated secondary ion mass spectrometry (SIMS). In a specific embodiment, substrate 101 has an infrared absorption peak at about 3175 cm$^{-1}$, with an absorbance per unit thickness of greater than about 0.01 cm$^{-1}$.

Substrate 101 may be characterized by a wurtzite structure substantially free from any cubic entities or other crystal structures, the other structures being less than about 0.1% in volume in reference to the substantially wurtzite structure.

Substrate 101 may be characterized by a total thickness variation (TTV) of less than about 25 micrometers, less than about 10 micrometers, less than about 5 micrometers, less than about 2 micrometers, or less than about 1 micrometer, and by a macroscopic bow that is less than about 200 micrometers, less than about 100 micrometers, less than about 50 micrometers, less than about 25 micrometers, or less than about 10 micrometers. Substrate 101 may have a concentration of macro defects on the surface 102, with a diameter or characteristic dimension greater than about 100 micrometers, of less than about 2 cm$^{-2}$, less than about 1 cm$^{-2}$, less than about 0.5 cm$^{-2}$, less than about 0.25 cm$^{-2}$, or less than about 0.1 cm$^{-2}$. The variation in miscut angle across a large-area surface 102 of substrate 101 may be less than about 5 degrees, less than about 2 degrees, less than about 1 degree, less than about 0.5 degree, less than about 0.2 degree, less than about 0.1 degree, less than about 0.05 degree, or less than about 0.025 degree in each of two orthogonal crystallographic directions. The root-mean-square surface roughness of surface 102, as measured over an area of at least 10 µm×10 µm, may be less than about 0.5 nanometers, less than about 0.2 nanometers, less than about 0.15 nanometers, less than about 0.1 nanometers, or less than about 0.05 nanometers. Substrate 101 may be characterized by n-type electrical conductivity, with a carrier concentration between about $1\times10^{17}$ cm$^{-3}$ and about $3\times10^{19}$ cm$^{-3}$ and a carrier mobility greater than about 100 cm$^2$/V-s. In certain embodiments, substrate 101 is highly transparent, with an optical absorption coefficient at a wavelength of 405 nanometers, or of 450 nanometers, that is less than about 10 cm$^{-1}$, less than about 5 cm$^{-1}$, less than about 2 cm$^{-1}$, less than about 1 cm$^{-1}$, less than about 0.5 cm$^{-1}$, less than about 0.2 cm$^{-1}$, or less than about 0.1 cm$^{-1}$.

In certain embodiments, one or more n-type, first non-absorber layers 105, comprising $Al_uIn_vGa_{1-u-v}N$ layers, where 0≤u, v, u+v≤1, is deposited on the substrate. In certain embodiments, one or more additional layers are deposited to help manage stress in the overall structure. The carrier concentration in first non-absorber layer 105 may lie in the range between about $10^{16}$ cm$^{-3}$ and $10^{20}$ cm$^{-3}$. In certain embodiments, silicon, germanium, or oxygen is the dopant in first non-absorber layer 105. In certain embodiments, germanium is selected as the n-type dopant. In certain embodiments, the carrier concentration in first non-absorber layer 105 lies in the range between $5 \times 10^{17}$ cm$^{-3}$ and $10^{20}$ cm$^{-3}$ or between $2 \times 10^{18}$ cm$^{-3}$ and $6 \times 10^{19}$ cm$^{-3}$. A high doping level may be particularly desirable if substrate 105 has a (0001) +c-plane orientation, as piezoelectric fields may more effectively be screened for efficient carrier collection. Abrupt or graded composition or doping profiles may be incorporated at interfaces within the first non-absorber layer. The deposition may be performed using metalorganic chemical vapor deposition (MOCVD) or molecular beam epitaxy (MBE). For example, the substrate may be placed on a susceptor in an MOCVD reactor. After closing, evacuating, and back-filling the reactor, the susceptor may be heated to a temperature between about 800 and about 1350 degrees Celsius in the presence of a nitrogen-containing gas. In one specific embodiment, the susceptor is heated to approximately 1185 degrees Celsius under flowing ammonia. A flow of a gallium-containing metalorganic precursor, such as trimethylgallium (TMG), triethylgallium (TEG), or triisopropylgallium may be initiated, in a carrier gas, at a total rate between approximately 1 and 50 standard cubic centimeters per minute (sccm). The carrier gas may comprise hydrogen, helium, nitrogen, or argon. The ratio of the flow rate of the group V precursor (ammonia) to that of the group III precursor (trimethylgallium, triethylgallium, trimethylindium, trimethylaluminum) during growth is between about 2000 and about 12000. A flow of disilane in a carrier gas, with a total flow rate of between about 0.1 and 10 sccm, may be initiated. In certain embodiments, doping is achieved by adding one or more of $SiH_4$, $Si_2H_6$, $SiH_2Cl_2$, $SiHCl_3$, $SiCl_4$, $GeH_4$, $GeCl_4$, $O_2$, and $H_2O$ to the input gases. In certain embodiments, one or more non-absorber layers is a metamorphic buffer layer and facilitates accommodation of lattice constant differences between layers. In certain embodiments, the doping level in the first non-absorber layer may be non-uniform, with two or more levels of doping and/or graded doping levels. In certain embodiments, the substrate temperature is varied during the deposition of the first non-absorber layer. In certain embodiments, the substrate temperature is held at a high value, for example, between 1100 and 1350 degrees Celsius for a first portion of the first non-absorber layer, then reduced to a lower value, for example, the same temperature as the temperature at which the absorber layer is deposited, for a second portion of the first absorber layer, for example, between about 700 and about 950 degrees Celsius. In certain embodiments, the thickness of the second portion of the first non-absorber layer is between about 1 nanometer and about 20 nanometers.

Following deposition of the n-type first non-absorber layer 105 for a predetermined period of time, so as to achieve a predetermined thickness, an absorber layer 107 is deposited. In certain embodiments, the absorber layer is deposited by MOCVD, at a substrate temperature between about 700 and about 950 degrees Celsius. Indium may be added to the absorber layer by using at least one of trimethylindium (TMIn), triethylindium (TEIn), and triisopropylindium as a precursor in MOCVD. The deposition rate for the absorber layer may be chosen to lie between about 0.005 and about 1 nanometer per second, or between about 0.01 and about 0.5 nanometer per second, or between about 0.02 and about 0.2 nanometer per second. In certain embodiments, the absorber layer is unintentionally doped. In certain embodiments, the absorber layer is n-type doped, using oxygen, silicon, or germanium, as a dopant, with a dopant concentration between about $5 \times 10^{15}$ cm$^{-3}$ and about $5 \times 10^{19}$ cm$^{-3}$, or between about $5 \times 10^{16}$ cm$^{-3}$ and about $5 \times 10^{18}$ cm$^{-3}$. In certain embodiments, the absorber layer is p-type doped, using Mg as a dopant, with a dopant concentration between about $5 \times 10^{15}$ cm$^{-3}$ and about $5 \times 10^{19}$ cm$^{-3}$, or between about $5 \times 10^{16}$ cm$^{-3}$ and about $5 \times 10^{18}$ cm$^{-3}$. The absorber layer may comprise a single quantum well or a multiple quantum well, with 2-50 quantum wells. In some embodiments, the absorber layer includes between about 10 and about 30 quantum wells. The quantum wells may comprise InGaN wells and GaN barrier layers. In other embodiments, the well layers and barrier layers comprise $Al_w In_x Ga_{1-w-x}N$ and $Al_y In_z Ga_{1-y-z}N$, respectively, where $0 \leq w$, x, y, z, w+x, y+z $\leq 1$, where w<u, y and/or x>v, z so that the bandgap of the well layer(s) is less than that of the barrier layer(s) and of the non-absorber layers. The well layers and barrier layers may each have a thickness between about 0.5 nanometer and about 20 nanometers. In certain embodiments, the barrier layers have a thickness between about 1 nanometer and about 3 nanometers, between about 3 nanometers and about 5 nanometers, between about 5 nanometers and 10 nanometers, or between about 10 nanometers and 15 nanometers. In certain embodiments, the well layers have a thickness between 0.5 nanometer and about 1.5 nanometer, between about 1.5 nanometer and about 2.5 nanometers, between about 2.5 nanometers and about 3.5 nanometers, between about 3.5 nanometers and about 4.5 nanometers, or between about 4.5 nanometers and about 10 nanometers. In another embodiment, the absorber layer includes or consists of a double heterostructure, with an InGaN or $Al_w In_x Ga_{1-w-x}N$ layer about 20 nm to about 500 nm thick surrounded by GaN or $Al_y In_z Ga_{1-y-z}N$ layers, where w<u, y and/or x>v, z. In certain embodiments, the thickness of the double heterostructure is between about 10 nanometers and about 25 nanometers, between about 25 nanometers and about 40 nanometers, between about 40 nanometers and about 60 nanometers, between about 60 nanometers and about 100 nanometers, between about 100 nanometers and about 200 nanometers, or thicker than about 200 nanometers. Abrupt or graded composition or doping profiles may be incorporated at interfaces within the absorber layer. The composition and structure of the active layer are chosen to provide light absorption at a preselected wavelength, for example, at 405 nanometers or at 450 nanometers. In certain embodiments, the wavelength is selected to lie between about 400 nanometers to about 500 nanometers. The absorber layer may be characterized by photoluminescence spectroscopy. In certain embodiments, the composition of the absorber layer is chosen such that the photoluminescence spectrum has a peak that is longer in wavelength than the desired absorption wavelength of the photodiode structure by between 5 nanometers and 50 nanometers or by between 10 nanometers and 25 nanometers. In certain embodiments, the quality and layer thicknesses within the absorber layer are characterized by x-ray diffraction.

In some embodiments, one or more additional second non-absorber layers 109 is deposited next. Second non-absorber layer 109 may comprise $Al_s In_t Ga_{1-s-t}N$, where $0 \leq s$, t, s+t $\leq 1$, with a higher bandgap than the absorber layer, and may be doped p-type. In one specific embodiment, second non-absorber layer 109 comprises AlGaN. In another embodiment, non-absorber layer 109 comprises an AlGaN/GaN multi-quantum barrier (MQB), comprising alternating layers of AlGaN and GaN, each with a thickness between about 0.2 nm and about 5 nm. In certain embodiments, one or more non-absorber layer is a metamorphic buffer layer and facilitates accommodation of lattice constant differences between layers. Abrupt or graded composition or doping profiles may be incorporated at interfaces within the second non-absorber layer. In some embodiments, the optical designs of the non-absorber layers are tuned to achieve greater than about 70% optical reflection of light transmitted from the substrate through the absorber layers.

Next, a p-type doped $Al_qIn_rGa_{1-q-r}N$ layer 111, where $0 \leq q$, r, $q+r \leq 1$, layer is deposited above the absorber layer and, if present, the second non-absorber layer. The p-type layer 111 may be doped with Mg, to a level between about $10^{16}$ cm$^{-3}$ and $10^{21}$ cm$^{-3}$ and may have a thickness between about 5 nanometers and about 1 micrometer, between about 20 nanometers and about 400 nanometers, or between about 100 nanometers and about 250 nanometers. In certain embodiments, the concentration of Mg in the p-type layer closest to the absorber layer is between $10^{18}$ cm$^{-3}$ and $10^{21}$ cm$^{-3}$, between $3 \times 10^{18}$ cm$^{-3}$ and $3 \times 10^{20}$ cm$^{-3}$, or between $10^{19}$ cm$^{-3}$ and $2 \times 10^{20}$ cm$^{-3}$. A high doping level may be particularly desirable if substrate 105 has a (0001) +c-plane orientation, as piezoelectric fields may more effectively screened for efficient carrier collection. The outermost 1-30 nanometers of the p-type layer may be doped more heavily than the rest of the layer, so as to enable an improved electrical contact. In certain embodiments, the substrate temperature is varied during the deposition of the p-typed doped layer. In certain embodiments, the substrate temperature is held at a low value, for example, the same temperature as the temperature at which the absorber layer is deposited, for a first portion of the p-typed doped layer, for example, between about 700 and about 950 degrees Celsius. Then the substrate temperature is raised to a higher level, for example, between about 750 and about 1000 degrees Celsius, for a second portion of the p-type doped layer. In certain embodiments, the thickness of the first portion of the p-type doped layer is between about 1 nanometer and about 20 nanometers, or between about 20 nanometers and 40 nanometers.

In a specific embodiment, a tunnel junction and another n-type layer are deposited on top of the p-type layer 111. In certain embodiments, one or more additional non-absorber layers and additional absorber layers are deposited overlying the tunnel junction.

The semiconductor layers, which include the n-type first non-absorber layer 105, absorber layer 107, one or more optional p-type second non-absorber layer 109, p-type layer 111, and may also include additional absorber layers, one or more n-type cladding layers, and one or more p-type cladding layers, have the same crystallographic orientation, to within about two degrees, within about one degree, or within about 0.5 degree, of the crystallographic orientation of surface 102 of substrate 101, have a very high crystalline quality, comprise nitrogen, and may have a surface dislocation density below $10^9$ cm$^{-2}$. The semiconductor layers may have a surface dislocation density below $10^8$ cm$^{-2}$, below $10^7$ cm$^{-2}$, below $10^6$ cm$^{-2}$, below $10^5$ cm$^{-2}$, below $10^4$ cm$^{-2}$, below $10^3$ cm$^{-2}$, or below $10^2$ cm$^{-2}$. In some embodiments, the semiconductor layers are substantially transparent, with an optical absorption coefficient below 100 cm$^{-1}$, below 50 cm$^{-1}$ or below 5 cm$^{-1}$ at wavelengths between about 700 nm and about 3077 nm and at wavelengths between about 3333 nm and about 6667 nm.

In a specific embodiment, the semiconductor layers have an orientation within five degrees of m-plane and the FWHM of the 1-100 x-ray rocking curve of the top surface is below 300 arc sec, below 100 arc sec, or below 50 arc sec. In another specific embodiment, the semiconductor layers have an orientation within five degrees of a-plane and the FWHM of the 11-20 x-ray rocking curve of the top surface is below 300 arc sec, below 100 arc sec, or below 50 arc sec. In yet another specific embodiment, the semiconductor layers have an orientation within five degrees of a semi-polar orientation selected from $\{1 -1\ 0\ \pm 1\}$, $\{1 -1\ 0\ \pm 2\}$, $\{1 -1\ 0\ \pm 3\}$, $\{2\ 0 -2\ \pm 1\}$, $\{3\ 0 -3\ \pm 1\}$, or $\{1\ 1 -2\ \pm 2\}$ and the FWHM of the lowest-order semipolar symmetric x-ray rocking curve of the top surface is below 300 arc sec, below 100 arc sec, or below 50 arc sec. In another specific embodiment, the semiconductor layers have an orientation within five degrees of (0001) c-plane and the FWHM of the 0002 x-ray rocking curve of the top surface is below 300 arc sec, below 100 arc sec, or below 50 arc sec. In still another specific embodiment, the semiconductor layers have an orientation within ten degrees of (000-1) c-plane and the FWHM of the 0002 x-ray rocking curve of the top surface is below 300 arc sec, below 100 arc sec, or below 50 arc sec.

In certain embodiments, for process development purposes, it may be useful to fabricate structures with one or more of the above-described layers missing. For example, the p-type GaN layer and the absorber layer could be omitted for purposes of developing or optimizing a reflective p-type electrical contact, as described below. One or more of the p-type contact layer and the p-type layer could be omitted for purposes of developing or optimizing the electrical, optical and material properties of the absorber layer.

The crystallographic orientation of the semiconductor layers and the doping and bandgap profile may have a major impact on the performance of the photodiode. It is well known that for +c-plane GaN-based devices containing heterostructures, spontaneous and piezoelectric polarization, due to the strong polarity of the Ga—N bond and the lack of inversion symmetry in the wurtzite crystal structure, can create strong electric fields that can result in unfavorable device performance. We find that these fields can negatively impact the performance of photodiode structures, particularly at high current densities, and have identified and disclosed herein several approaches to overcome these effects.

The use of +c-plane substrates, that is, where the crystallographic orientation is within 5 degrees, within 2 degrees, within 1 degree, or within 0.5 degree of (0001), has several advantages for high-power photodiode structures and photodiodes, including 1) a more mature commercial supply chain with large-area, epi-ready substrates, 2) well-established, stable epitaxy growth conditions, and 3) relative ease in controlling dopant concentrations over many orders of magnitude. However, as illustrated in the Comparative Examples below, the use of relatively-standard LED-type structures may not enable photodiodes with high fill factors.

In certain embodiments, the deleterious effects of spontaneous and piezoelectric fields in +c-plane photodiodes, which become progressively more severe as the In percent in the absorber layer is increased, are mitigated by the use of high doping levels on both the n-side and the p-side of the absorber layer. The impacts of bandgap alignment and spontaneous and piezoelectric fields on photodiode performance at high current densities has been investigated. The semiconductor layers used in the analysis of photodiode performance are shown schematically in FIG. 7. Absorber layer 730 is positioned between n-type doped layer 710 and p-type doped layer 750. Optionally, an n-type cladding layer 720 is interposed between n-type doped layer 710 and absorber layer 730. Optionally, a p-type cladding layer 740 is interposed between absorber layer 730 and p-type doped layer 750. For simplicity, the absorber layer 730 was modeled as a double heterostructure, with a thickness of 40 nanometers, but similar effects are expected when the absorber layer consists of or includes multiple quantum well (MQW) structures.

Figure 8A:
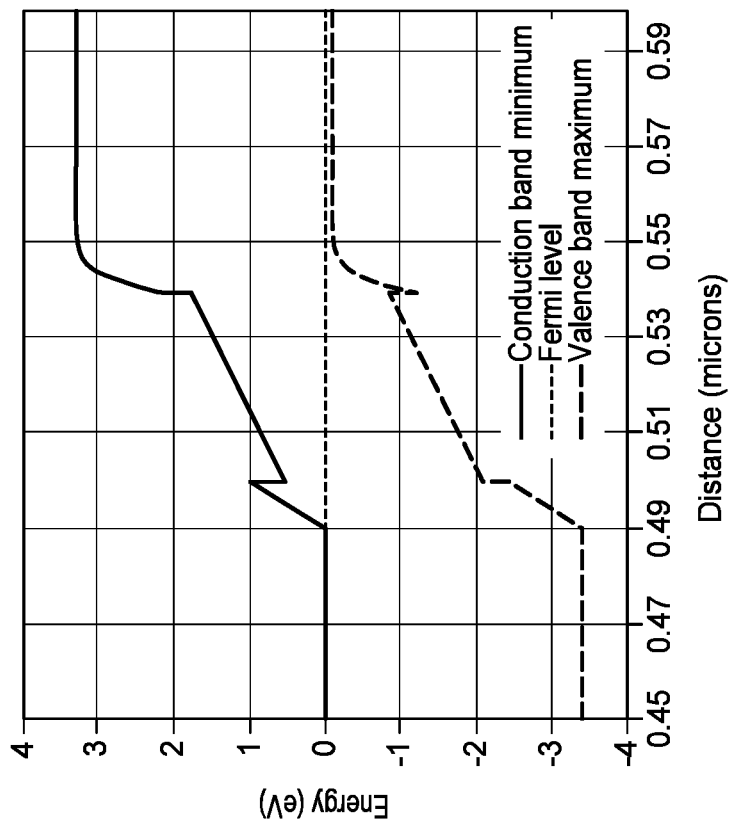
FIGS. 8A, 9A, and 10A are simplified diagrams showing photocurrent as a function of applied voltage for a photodiode structure according to embodiments of the current disclosure.
Figure 8B:
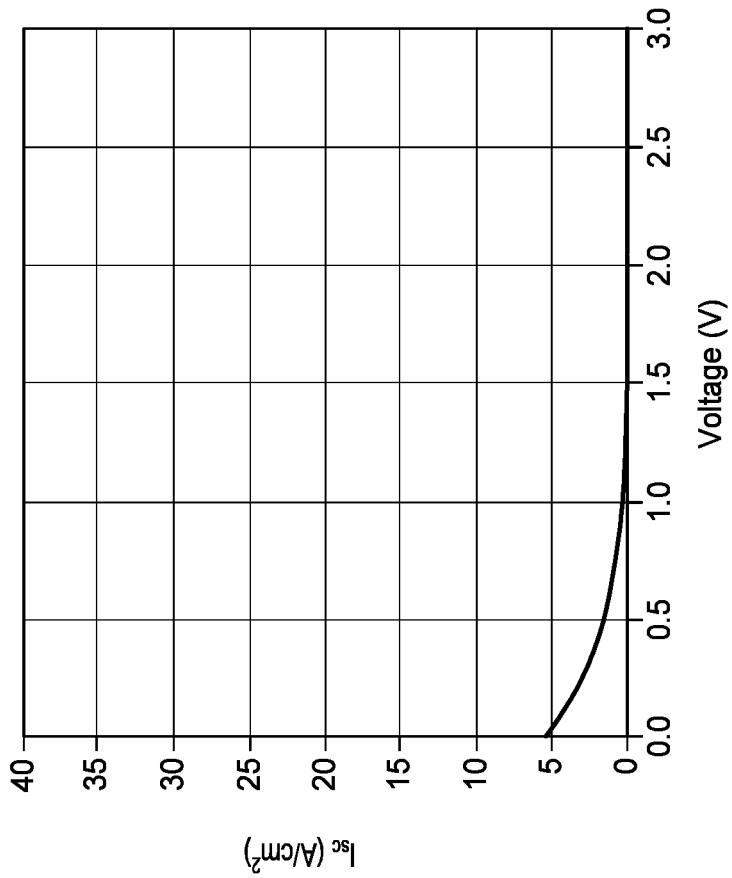
FIGS. 8B, 9B, and 10B are simplified diagrams showing local band structure as a function of position within a photodiode structure according to embodiments of the current disclosure.
Figure 9B:
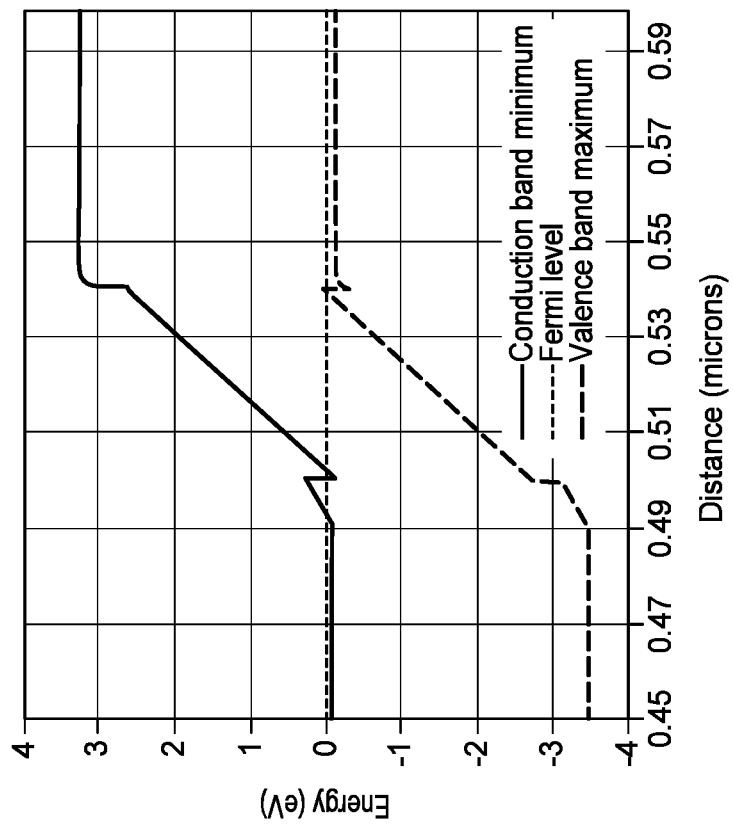
Figure 9A:
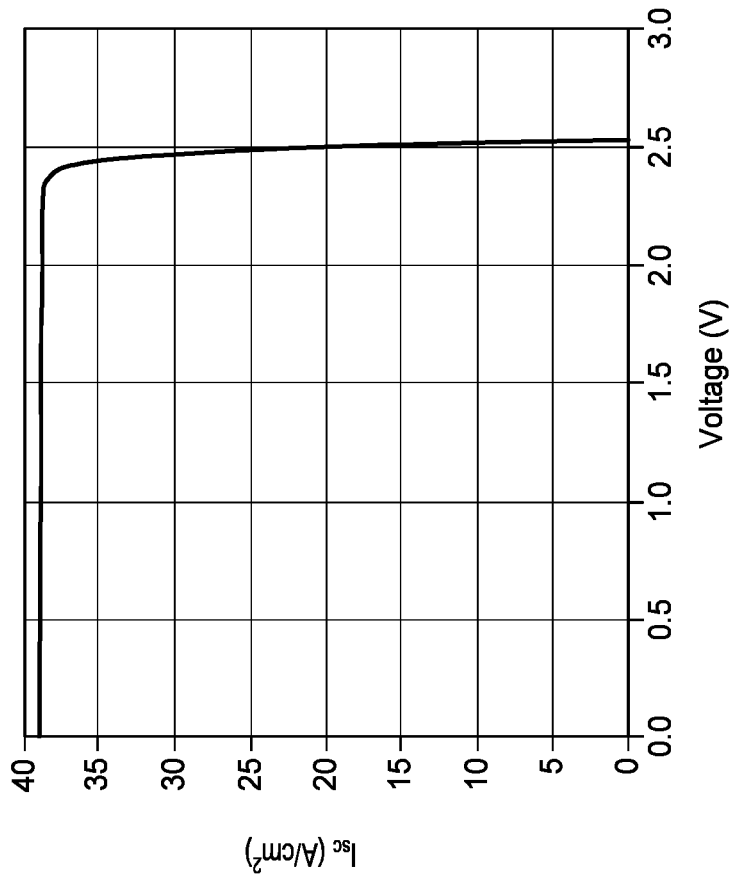
Figure 10A:
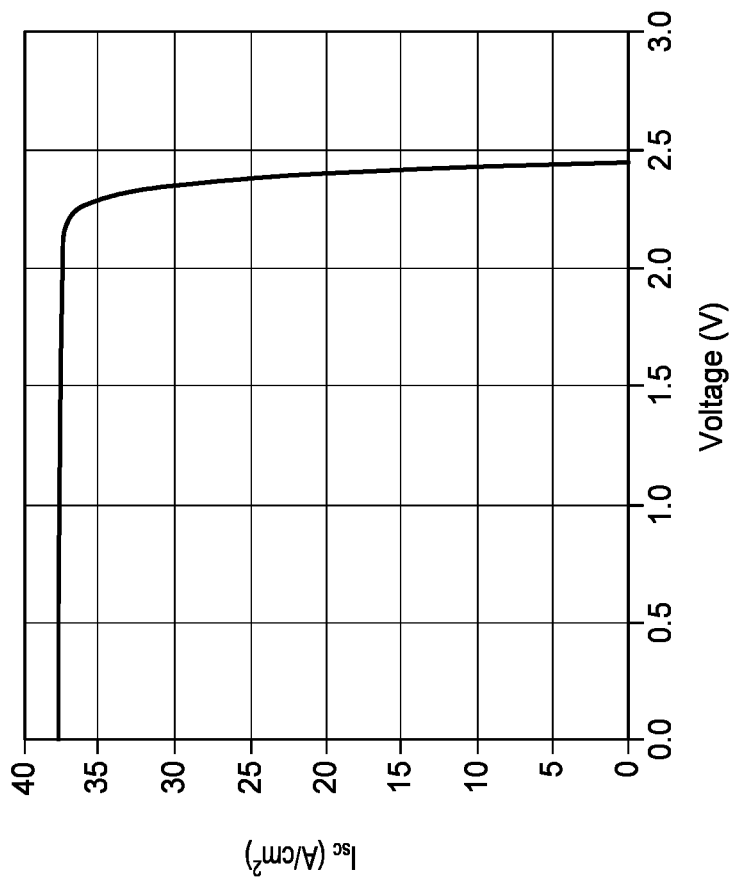
Figure 10B:
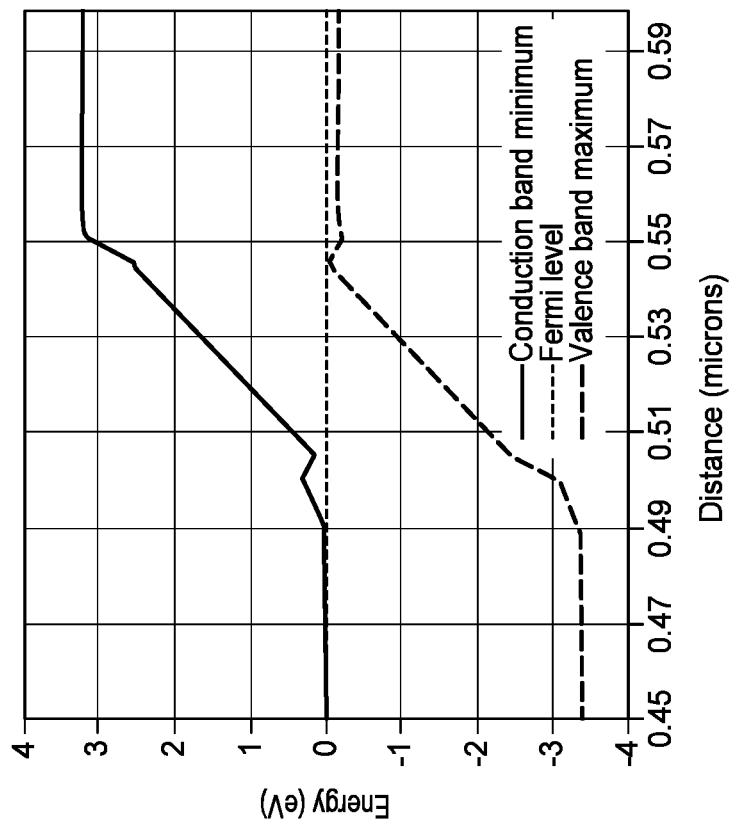

In the case of absorber layers containing one or more layers that include $In_{0.18}Ga_{0.82}N$, which are appropriate for absorption of light having a wavelength of about 473 nanometers or less, the short-circuit current and fill factor are very low when the doping level of the n-type layer in contact with a first side of the absorber layer is $2.0\times10^{19}$ $cm^{-3}$ and the doping level of the p-type layer in contact with a second side of the absorber layers is $2.0\times10^{19}$ $cm^{-3}$, as shown in FIG. 8A. This very poor performance is believed to be due to poor screening of the electric fields related to the polarization discontinuity and band offsets between InGaN and GaN, as shown in FIG. 8B. However, when the doping level of the n-type layer in contact with a first side of the absorber layer is raised to $3.5\times10^{19}$ $cm^{-3}$ and the doping level of the p-type layer in contact with a second side of the absorber layers is raised to $6.0\times10^{20}$ $cm^{-3}$, the illuminated I-V performance is much better, as shown in FIG. 9A. This greatly improved performance is due to much better screening of the electric fields in the absorber layer and in close proximity to the GaN—InGaN interface, as shown in FIG. 9B. As shown in the table illustrated in FIG. 15, improvements in fill factor FF can be achieved by increasing the doping levels in both layers in contact with the absorber layer. In particular, fill factors above 90% can be achieved by doping in the n-type doped layer at a concentration of about $3.5\times10^{19}$ $cm^{-3}$ or higher and by the activated doping level in the p-type layer at a concentration of about $2.0\times10^{20}$ $cm^{-3}$ or higher.

In some embodiments, the photodiode structure includes an n-type layer, at least one absorber layer, and a p-type layer that each have a threading dislocation density below $10^7$ $cm^{-2}$. The photodiode structure may also include one or more absorber layers, an n-type layer, and a p-type layer that have a crystallographic orientation that differs from (000-1)–c-plane by between 2 degrees and 5 degrees. The photodiode structure may also include one or more absorber layers, an n-type layer, and a p-type layer that have a crystallographic orientation within 5 degrees of {10-10} m-plane and each of the n-type and p-type layers are characterized by a dopant concentration of at least $4\times10^{18}$ $cm^{-3}$. The photodiode structure may also include one or more absorber layers, an n-type layer, and a p-type layer that have a crystallographic orientation within 5 degrees of a semipolar plane selected from {10-1-2}, {10-1-1}, {20-2-1}, and {30-3-1} and each of the n-type and p-type layers are characterized by a dopant concentration of at least $2\times10^{18}$ $cm^{-3}$.

FIG. 15 includes the illuminated I-V performance characteristics of InGaN/GaN photodiode structures having the structure indicated schematically in FIG. 7. For simplicity, the absorber layer is modeled as a 40 nanometer thick double heterostructure.

In the case of absorber layers containing one or more layers that include $In_{0.12}Ga_{0.88}N$, which are appropriate for absorption of light having a wavelength of about 435 nanometers or less, the fill factor is below 60% when the doping level of the n-type layer in contact with a first side of the absorber layer is $2.0\times10^{19}$ $cm^{-3}$ and the doping level of the p-type layer in contact with a second side of the absorber layers is $8.0\times10^{18}$ $cm^{-3}$. However, when the doping level of the p-type layer in contact with the second side of the absorber layers is raised to $2.0\times10^{19}$ $cm^{-3}$, the fill factor is raised to almost 80%, and when the doping level of the p-type layer in contact with the second side of the absorber layers is raised further to $1.0\times10^{20}$ $cm^{-3}$, the fill factor is raised to about 93%. The results in the table of FIG. 15 show that if the doping level in a cladding layer adjacent to the absorber layer is reduced, relative to the doping level in the p-type doped layer, the fill factor is reduced significantly. This result is significant because it may be difficult to achieve full doping all the way up to deposition of the undoped absorber layer, thus producing a sharp transition in the doping profile, and immediately upon switching from an undoped absorber layer deposited at a temperature below 950 degrees Celsius to a p-type doped layer, which is deposited at considerably higher temperature, that has a desired doping level. However, as also shown in the table of FIG. 15, improvements in the fill factor FF can also be achieved by introducing doped cladding layers on one or both of the n-type and p-type sides of the absorber layer, particularly when the cladding layer has an indium concentration intermediate between that of the absorber layer and of the n-type doping layer and/or the p-type doping layer. The intermediate indium concentration in the cladding layer may be uniform, continuously graded, or step graded. The cladding layer may include a strained layer superlattice. In some embodiments, the photodiode structure includes at least one of an n-type cladding layer and a p-type cladding layer, wherein the n-type cladding layer lies between an n-type layer and one or more absorber layers, and wherein the n-type cladding layer has a dopant concentration of at least $2\times10^{19}$ $cm^{-3}$, and the p-type cladding layer lies between the one or more absorber layers and a p-type layer, and wherein the p-type cladding layer has a dopant concentration of at least $5\times10^{19}$ $cm^{-3}$.

In certain embodiments, the deleterious effects of spontaneous and piezoelectric fields in +c-plane photodiodes are mitigated by use of a −c-plane substrate that has a crystallographic orientation that is within 10 degrees, such as within 6 degrees, within 5 degrees, within 4 degrees, within 3 degrees, within 2 degrees, or within 1 degree of (000-1). In certain embodiments, the substrate and the semiconductor layers have a crystallographic orientation that differs from (000-1) by between 2 degrees and 5 degrees. In certain embodiments, the substrate and the semiconductor layers are misoriented from (000-1) toward a <10-10> m-direction. In certain embodiments, the substrate and the semiconductor layers are misoriented from (000-1) toward a <11-20> a-direction. Referring again to the table of FIG. 15, it has been found that doping concentrations of $1.0\times10^{16}$ $cm^{-3}$ or $1.0\times10^{17}$ $cm^{-3}$ or $1.0\times10^{18}$ $cm^{-3}$ in the n-type doped and the p-type doped layers, which are immediately adjacent to the absorber layer, are sufficient to achieve a high fill factor for both 12% and 18% indium concentrations in the absorber layer. It is believed that a fill factor greater than 85% can be achieved if the doping concentration in the n-type doped layers and p-type doped layers is between $1.0\times10^{16}$ $cm^{-3}$ and $1.0\times10^{20}$ $cm^{-3}$ for absorber Indium concentrations greater than 8% in the case where the substrate and the semiconductor layers each have a −c crystallographic orientation. In one example, the photodiode structure is characterized by a fill factor of at least 50% under an illumination level producing a current density of at least 10 A $cm^{-2}$.

In certain embodiments, the deleterious effects of spontaneous and piezoelectric fields in +c-plane photodiodes are mitigated by use of an m-plane substrate, that is, with an orientation within where the crystallographic orientation is within 5 degrees, within 2 degrees, within 1 degree, or within 0.5 degree of (10-10). Referring again to the table of FIG. 15, it has been found that a doping concentration of $2.0 \times 10^{19}$ cm$^{-3}$ in the n-type doped and the p-type doped layers, which are immediately adjacent to the absorber layer, are sufficient to achieve a fill factor above 90% for both 12% and 18% indium concentrations in the absorber layer.

In certain embodiments, the deleterious effects of spontaneous and piezoelectric fields in +c-plane photodiodes are mitigated by use of semipolar substrate that has a crystallographic orientation that is within 5 degrees, within 2 degrees, within 1 degree, or within 0.5 degree of {20-2-1} or {30-3-1}. Referring again to the table of FIG. 15, it has been found that a doping concentration of $8.0 \times 10^{18}$ cm$^{-3}$ in the n-type doped and the p-type doped layers, which are immediately adjacent to the absorber layer, are sufficient to achieve a fill factor above about 90% for both 12% and 18% indium concentrations in the absorber layer.

In certain embodiments, in order to reduce the carbon content in N-polar or semipolar InGaN layers, triethylgallium (TEG) and triethylindium (TEIn) are used as the metalorganic precursors rather than the more conventional trimethyl gallium (TMG) and trimethylindium (TMIn). For example, the carbon concentration in the semiconductor layers may be less than $1 \times 10^{18}$ cm$^{-3}$ or less than $1 \times 10^{17}$ cm$^{-3}$. In certain embodiments, the ratio of hydrogen (H$_2$) and nitrogen (N$_2$) carrier gas, the substrate temperature, and the pressure are optimized to minimize formation of hillocks in the N-polar semiconductor layers.

In certain embodiments, the semiconductor layers are annealed to electrically activate the p-type dopant. In certain embodiments, the annealing is performed in situ in the MOCVD reactor used to deposit the semiconductor layers, for example, under flowing N$_2$ to a temperature between about 500 degrees Celsius and about 900 degrees Celsius. In certain embodiments, the annealing is performed in furnace or in a rapid thermal annealing (RTA) oven, for example, under flowing N$_2$ to a temperature between about 400 degrees Celsius and about 900 degrees Celsius. In certain embodiments, the atmosphere during the annealing process may also contain an oxidizing gas such as O$_2$. In certain embodiments, the fraction of the oxidizing gas within the annealing atmosphere is between about 5% and about 95%. In certain embodiments, the duration of the annealing process is between about one second and about five hours, or between about 10 seconds and about one hour. In certain embodiments, after annealing, the surface of the semiconductor layers is cleaned to prepare them for additional deposition. In certain embodiments, the cleaning includes or consists of one or more of treatment by a mineral acid, such as hydrochloric acid, nitric acid, or aqua regia, a piranha etch, a buffered oxide etch, by dry etching, or by treatment with a plasma, such as an argon plasma.

In certain embodiments, a transparent conductive layer is deposited on the p-type semiconductor layer. In certain embodiments, the transparent conductive layer comprises a transparent conductive oxide (TCO) such as indium tin oxide or aluminum zinc oxide. In certain embodiments, the transparent conductive layer is deposited by a one or more of thermal evaporation, electron-beam evaporation, and sputtering. In certain embodiments, the deposited TCO layer is annealed in a controlled atmosphere containing oxygen at a temperature between about 300 and 700 degrees Celsius, so as to co-optimize the optical/transparency and electrical properties of the TCO layer. In certain embodiments, the transparent conductive layer has a thickness between about 10 nanometers and about 1000 nanometers.

The photodiode structures described in the present disclosure are intended for use in a packaged photodiode with a multiple-reflection geometry. As such, it is important to maximize the reflectivity of the front and back faces of the structure. In addition, in order to maximize the efficiency of the photodiode, it is important to minimize the electrical resistance of the contacts. Referring again to FIG. 1, a reflective p-side electrical contact 113 may then be deposited on the p-type semiconductor layer 111. In a preferred embodiment, the average reflectivity of the reflective p-side electrical contact is greater than 70%, greater than 80%, greater than 85%, or greater than 90% at a specific angle or range of angles at which light is incident during operation. In general, the term "average reflectivity" as used herein is intended to broadly describe a reflectance value that is calculated by averaging at least two reflectance measurement data points on a surface at a specific wavelength between 390 nanometers and 460 nanometers and at one or more angles with respect to the surface of the layer that are representative of the range of incident angles during device operation. During operation of the photodiode structure, in some embodiments, light (or optical radiation) is coupled into a vertical edge, or approximately vertical edge, of the photodiode structure and the angle of incidence of the light on the reflective layers (e.g., reflective mirror layer 113 or n-side electrical contact 114 in FIG. 2) internally is between about 0.1 and about 30 degrees, between about 0.2 and about 20 degrees, or between about 0.3 and about 10 degrees, as measured from the plane of the reflective layers. In one example, the light receiving surface 252, which is illustrated in FIG. 2, is oriented as a vertical edge of the photodiode structure or a vertical plane within the photodiode structure. In some embodiments of the photodiode structure, light is coupled into a non-vertical edge of the photodiode structure and the angle of incidence on the reflective layers internally is between about 0.1 and about 60 degrees, between about 0.2 and about 40 degrees, or between about 0.3 and about 20 degrees, as measured from the plane of the reflective layers. In other embodiments of the photodiode structure, light is coupled into a large area surface of the photodiode structure through an aperture, and the angle of incidence on the reflective layers internally is between about 30 and 90 degrees, between about 45 and 90 degrees, or between about 60 and 90 degrees, as measured from the plane of the reflective layers. In still other embodiments of the photodiode structure, light is coupled into a large area surface of the photodiode structure through an aperture and undergoes internal reflection at an oblique angle, and the angle of incidence on the reflective layers internally is between about 0.1 and about 45 degrees, between about 0.3 and about 30 degrees, or between about 0.5 and about 20 degrees, as measured from the plane of the reflective layers. The contact resistance of the reflective p-side electrical contact is less than $3 \times 10^{-3}$ $\Omega$cm$^2$, less than $1 \times 10^{-3}$ $\Omega$cm$^2$, less than $5 \times 10^{-4}$ $\Omega$cm$^2$, less than $2 \times 10^{-4}$ $\Omega$cm$^2$, less than $10^{-4}$ $\Omega$cm$^2$, less than $5 \times 10^{-5}$ $\Omega$cm$^2$, less than $2 \times 10^{-5}$ $\Omega$cm$^2$, or less than $10^{-5}$ $\Omega$cm$^2$. In preferred embodiments, the contact resistance is less than $5 \times 10^{-5}$ $\Omega$cm$^2$. The reflective p-side electrical contact may include at least one of silver, gold, aluminum, nickel, platinum, rhodium, palladium, titanium, chromium, germanium, ruthenium, magnesium, scandium, or the like. In some embodiments, the reflective p-side electrical contact may include or consist of at least two layers, with a first layer providing a good electrical contact and comprising platinum, nickel, aluminum, or titanium and having a thickness between 0.1 and 5 nanometers, and a second layer providing superior optical reflectivity and comprising silver, gold, or nickel and having a thickness between 0.4 nanometer and 1 micrometer. In certain embodiments, the reflective p-type contact may include or consist of at least three layers, at least four layers, or at least five layers. In certain embodiments, the reflective p-side contact comprises three layers, with the first layer comprising silver, with a thickness between about 1 nanometer and about 200 nanometers, a second layer comprising a moderately oxophilic metal, with a thickness between about 0.5 nanometer and about 2 nanometers, and a third layer comprising silver, with a thickness between about 50 nanometers and about 200 nanometers. In certain embodiments, the moderately oxophilic metal includes or consists of nickel. In certain embodiments, the moderately oxophilic metal includes or consists of or includes one or more of copper, cobalt, iron, and manganese. In certain embodiments, the reflective p-side electrical contact is annealed after deposition to improve its reflectivity and/or to reduce its contact resistance. In certain embodiments, the annealing is performed in an RTA furnace, to a temperature between about 300 degrees Celsius and about 1000 degrees Celsius. In certain embodiments the reflective p-side contact is annealed to a temperature between about 500 and about 900 degrees Celsius under a controlled atmosphere containing oxygen at a partial pressure between about 0.1 Torr and about 200 Torr, so as to cause interdiffusion between the moderately oxophilic metal and silver and introduction of a controlled concentration of oxygen atoms into the reflective p-side contact layer. In preferred embodiments, the partial pressure of oxygen is reduced below about $10^{-4}$ Torr before cooling the reflective p-side contact below a temperature of about 250 degrees Celsius, so as to avoid formation of excess silver oxide. In certain embodiments, the reflective p-side contact includes oxygen with a maximum local concentration between about $1\times10^{20}$ cm$^{-3}$ and about $7\times10^{20}$ cm$^{-3}$. Further details are described in U.S. Pat. No. 9,917, 227, which is hereby incorporated by reference in its entirety. The reflective p-side electrical contact may be deposited by thermal evaporation, electron beam evaporation, sputtering, or another suitable technique. In a preferred embodiment, the reflective electrical contact serves as the p-side electrode for the power photodiode. In certain embodiments, the reflective p-side contact is planar and parallel to the semiconductor layers, which may be useful for maximizing its reflectivity. In alternative embodiments, the reflected p-side contact is patterned or textured, which may be useful for admission or extraction of light, for example, within an aperture.

In certain embodiments, a reflectance measurement of a particular reflective surface may be performed by preparing at least two sample types, with one having the reflective surface left intact and the other having the reflective surface removed. Both samples may be fabricated such that measurement probe light is coupled in with low reflectance through a first surface, undergoes reflection and refraction from a second surface corresponding to the reflective surface that is to be measured, and is coupled out with low internal reflectance through a third surface. In some embodiments, reflections at the first and third surfaces are minimized by application of a dielectric anti-reflective coating tuned to the wavelength of the probe light. Reflections at the first and third surfaces can be reduced further by fabricating the samples such that light transmits through the first and third surfaces at near normal incidence. The optical power transmitted out of the surface corresponding to the reflective surface and the third surface are measured for both sample types and used to calculate the reflectance of the reflective surface according to methods that are well known in the art.

In certain embodiments, a reflective n-side electrical contact 114, with an average reflectivity greater than about 70%, is deposited on the back side of substrate 101. In a preferred embodiment, the average reflectivity of the reflective n-side electrical contact is greater than 80%, greater than 85%, or greater than 90% at a specific angle or range of angles at which light is incident during operation. The contact resistance of the reflective n-side electrical contact is less than $1\times10^{-3}$ $\Omega$cm$^2$, less than $5\times10^{-4}$ $\Omega$cm$^2$, less than $2\times10^{-4}$ $\Omega$cm$^2$, less than $10^{-4}$ $\Omega$cm$^2$, less than $5\times10^{-5}$ $\Omega$cm$^2$, less than $2\times10^{-5}$ $\Omega$cm$^2$, or less than $10^{-5}$ $\Omega$cm$^2$. In preferred embodiments, the contact resistance is less than $5\times10^{-5}$ $\Omega$cm$^2$. The reflective n-side electrical contact may comprise at least one of silver, gold, aluminum, nickel, platinum, rhodium, palladium, titanium, chromium, or the like. In some embodiments, the reflective n-side electrical contact may include or consist of at least two layers, with a first layer providing a good electrical contact and comprising aluminum or titanium and having a thickness between 0.1 and 5 nanometers, and a second layer providing superior optical reflectivity and comprising aluminum, nickel, platinum, gold, or silver and having a thickness between 10 nanometers and 10 micrometers. In certain embodiments, the reflective n-side contact may include or consist of at least three layers, at least four layers, or at least five layers, so as to co-optimize the reflectivity (maximized), the contract resistance (minimized), and the robustness (maximized). The reflective n-side electrical contact may be deposited by thermal evaporation, electron beam evaporation, sputtering, or another suitable technique. In certain embodiments, the reflective electrical n-side contact serves as the n-side electrode for the power photodiode. In certain embodiments, the reflective n-side contact is planar and parallel to the semiconductor layers, which may be useful for maximizing its reflectivity. In alternative embodiments, the reflected n-side contact is patterned or textured, which may be useful for admission or extraction of light, for example, within an aperture.

In certain embodiments, particularly embodiments where the reflective n-side contact includes aluminum, in order to reduce the contact resistance of the reflective n-side contact, the back side of substrate 101 is processed by reactive ion etching (RIE) using a chlorine-containing gas or plasma. In one specific embodiment, the chlorine-containing gas or plasma includes SiCl$_4$. In certain embodiments, in order to reduce the contact resistance of the reflective n-side contact, further cleaning steps are performed. In certain embodiments, the further cleaning steps include or consist of one or more of treatment by a mineral acid, such as hydrochloric acid, nitric acid, or aqua regia, a buffered oxide etch, by dry etching, or by treatment with a plasma, such as an argon plasma.

In some embodiments, as shown in FIG. 2, the reflective p-side electrical contact comprises a two-component mirror/p-electrode including a discontinuous p-electrode 215 and a reflective mirror layer 113. The discontinuous p-electrode 215 is optimized as an electrical contact and can be made, for example, of a nickel/gold, or a platinum/gold stack where the nickel, or platinum is about 20 to 200 nm thick and the gold is about 100 nm to 1 micron thick. In one suitable embodiment, the discontinuous p-electrode 215 is a gridded electrode having grid openings of between about 1 micron and 0.1 cm on a side. The reflective mirror layer 113 may comprise at least one of silver, gold, aluminum, platinum, rhodium, palladium, chromium, or the like, and may be deposited over the p-type layer 111 and over the gridded p-electrode 215. Preferably, the mirror layer is deposited after any annealing processing of the discontinuous p-electrode to reduce interdiffusion. Optionally, a diffusion barrier layer such as nickel, rhodium, platinum, palladium, iridium, ruthenium, rhenium, tungsten, molybdenum, niobium, tantalum, or $MC_xN_yO_z$ (where M includes a metallic element such as aluminum, boron, silicon, titanium, vanadium, chromium, yttrium, zirconium, lanthanum, or a rare earth metal, and x, y, z are each between 0 and 3) is disposed between the discontinuous p-electrode 215 and the mirror layer 113. Assuming an operating current density of 10 A/cm², a sheet resistance of 4×10⁵ Ω/sq for the p-type layers, and that current is conducted from the p-type layer only to the gridded, discontinuous p-electrode contact 215 and not directly to the reflective mirror layer 113, the calculated percent power loss due to lateral conduction within the p-type layers is approximately 0.6, 3.6, and 14.5% for 2, 5, and 10 micron grid finger spacing, respectively. Rather than a grid configuration, the discontinuous p-electrode 215 can alternatively be arranged as an array of dots, rectangles, circles, or the like. The separation between the p-electrode array elements 215 is preferably between about 1 micron and 0.1 cm. The use of a reflective metal p-electrode or combination of reflective mirror layer and discontinuous electrode enables fabrication of large area power photodiodes without necessitating lateral carrier transport through p-doped layers over large distances, thus minimizing lateral ohmic losses and the series resistance in the device. Parasitic optical absorption by a discontinuous p-electrode can be minimized by designing the electrode pattern and orienting the light propagation path so that light incident on the discontinuous p-electrode pattern is largely avoided.

The photodiode structure may include a p-side electrical contact layer disposed over the p-type layer, wherein the p-side electrical contact layer has an average reflectance of at least 80% at a specific angle or range of angles at which light is incident during operation for wavelengths between 390 nanometers and 460 nanometers and a contact resistance below $1 \times 10^{-3}$ Ωcm².

As noted above, the photodiode structures described in the present disclosure are intended for use in a packaged photodiode with a multiple-reflection geometry. In some embodiments, during operation the packaged photodiode is configured to receive one or more wavelengths of light from an illumination source 251. The illumination source 251 may include a laser or other useful radiation source. In order to optimize the power efficiency of the photodiode, it is important to maximize the reflectivity of the front and back faces of the structure, and also the sides of individual photodiode die after singulation. In addition, it is important to minimize the electrical resistance of the contacts and to configure the arrangement of light receiving surface 252 of the photodiode to the reflective contact structures (for example, the reflective p-side contact and the reflective n-side contact). Referring again to FIG. 2, light of a desired wavelength, for example, 405 nanometers or 450 nanometers may enter the photodiode structure through an aperture (not shown) that includes the light receiving surface 252, propagate 253 within substrate 101 and the semiconductor layers, and be reflected from the reflective p-side contact 113 and the reflective n-side contact 114 and from an edge reflector (not shown). The light receiving surface 252 generally includes a portion of the photodiode device (or photodiode die) that is positioned and aligned to provide the radiation emitted from the illumination source 251 to a region of the photodiode disposed between the p-type reflective contact 113 and the n-type reflective contact 114, as shown in FIG. 2. The light receiving surface 252, in some embodiments, may include a region on an edge of the photodiode device, such as shown schematically in FIG. 2.

In other embodiments, the light receiving surface 252 may include an open region on one of the surfaces 255 or 256, which does not include portions of the materials used to form the p-type reflective contact 113 or the n-type reflective contact 114, respectively. In this configuration, the open region is designed to allow the radiation emitted from the illumination source 251 to enter the region of the photodiode disposed between the p-type reflective contact 113 and the n-type reflective contact 114. In some embodiments, the light receiving surface 252 is aligned relative to the photodiode device to cause light delivered from the illumination source 251 to be reflected at least once between the p-type reflective contact 113 and the n-type reflective contact 114. The light delivered from the illumination source 251 can, for example, have at least one wavelength between 390 nanometers and 460 nanometers.

In certain embodiments, as also shown in FIG. 2, a reflective n-side electrical contact comprises a two-component mirror/n-electrode including a discontinuous n-electrode 217 and a reflective mirror layer 114. The discontinuous n-electrode 217 is optimized as an electrical contact and can be made, for example, of a titanium/aluminum or a titanium/aluminum/gold stack where the titanium is about 5 to 200 nm thick and the aluminum or gold is about 100 nm to 1 micron thick. In one suitable embodiment, the discontinuous n-electrode 217 is a gridded electrode having grid openings of between about 1 micrometer and 1 centimeter on a side. Assuming an operating current density of 10 A/cm² and a sheet resistance of 0.27 Ω/sq for an n-type GaN substrate, the calculated percent power loss due to lateral conduction within the substrate layers is approximately 0.4, 2.5, and 9.8% for 0.2, 0.5, and 1 cm grid finger spacing, respectively. In certain embodiments, n-side contacts on the side of a singulated die prepared from this structure are added in addition to or instead of the backside n-side contact. In certain embodiments, n-contacts and p-contacts are added to the same side of the die, after formation of trenches to the n-type doped layer or the p-type doped layer, respectively, as needed. The trenches may be formed by lithography and dry or wet etching, as is well known in the art. The reflective n-side mirror layer 114 may comprise at least one of silver, gold, aluminum, platinum, rhodium, palladium, chromium, or the like, and may be deposited over the back side of substrate 101 and over the gridded n-electrode 217. Preferably, the mirror layer is deposited after any annealing processing of the discontinuous n-electrode to reduce interdiffusion. Optionally, a diffusion barrier layer such as nickel, rhodium, platinum, palladium, iridium, ruthenium, rhenium, tungsten, molybdenum, niobium, tantalum, or $MC_xN_yO_z$ (where M includes a metallic element such as aluminum, boron, silicon, titanium, vanadium, chromium, yttrium, zirconium, lanthanum, or a rare earth metal, and x, y, z are each between 0 and 3) is disposed between the discontinuous n-electrode 217 and the mirror layer 114. Rather than a grid configuration, the discontinuous n-electrode 217 can be arranged as an array of dots, rectangles, circles, or the like. The separation between the n-electrode array elements 217 is preferably between about 1 micron and 0.1 cm. The use of a reflective metal n-electrode or combination of reflective mirror layer and discontinuous electrode enables fabrication of large area power photodiodes without necessitating lateral carrier transport through substrate 101 over large distances, which may be important if the carrier concentration of substrate 101 is low in order to optimize transparency or if it is quite thin, for example, less than about 100 micrometers, less than about 50 micrometers, or less than about 25 micrometers. Parasitic optical absorption by a discontinuous n-electrode can be minimized by designing the electrode pattern and the light propagation path so that light incident on the discontinuous n-electrode pattern is largely avoided.

The photodiode structure may include an n-side electrical contact layer that has an average reflectance of at least 80% at a specific angle or range of angles at which light is incident during operation for wavelengths between 390 nanometers and 460 nanometers and has a contact resistance below $5 \times 10^{-4}$ $\Omega cm^2$.

In some embodiments, as illustrated in FIG. 3, at least one of the reflective p-side electrical contact and the reflective n-side electrical contact further comprises a semi-transparent current-spreading layer 321. The semi-transparent current-spreading layer 321 may comprise at least one of nickel oxide (NiO), nickel oxide/gold (NiO/Au), NiO/Ag, indium tin oxide (ITO), p-type zinc oxide (ZnO), ruthenium oxide ($RuO_2$), or the like. The semi-transparent current-spreading layer 321 facilitates electrical contact to the p-type GaN layer 111 or to the substrate 101, for example, ohmic or quasi-ohmic behavior. To minimize light absorption in the semi-transparent current-spreading layer 321, this layer has a thickness which is preferably between about 1 nm and about 100 nm, with more than 70% light transmission. Assuming an operating current density of 10 $A/cm^2$ and a sheet resistance of 25 $\Omega$/sq for the semi-transparent current-spreading layer 321 overlying the p-type layers, the calculated percent power loss due to lateral conduction within the current spreading layer is approximately 0.4, 2.3, and 9.1% for 0.02, 0.05, and 0.1 cm grid spacing, respectively.

In some embodiments, a transparent dielectric 319 is disposed on a portion of the semitransparent current-spreading layer 321 and between p-side electrical contacts 315 and/or n-side electrical contacts 317. The transparent dielectric may comprise at least one of $TiO_2$, $Ta_2O_5$, $ZrO_2$, $SiO_2$, $SiO_x$, $SiN_x$, $Si_3N_4$, $SiO_xN_y$, $Al_2O_3$, or $MgF_2$. The transparent dielectric 319 may be a quarter-wave thick, that is, have a thickness approximately equal to one-quarter of the incident photon wavelength in air divided by the refractive index of the dielectric medium. For example, in the case that the photodiode structure has a design wavelength of 405 nanometers and the transparent dielectric consists of $Ta_2O_5$, with a refractive index of approximately 2.28, the thickness of the transparent dielectric 319 may be chosen as about 405/2.28/4=44 nanometers. The transparent dielectric 319 includes open areas in which a p-side electrical contact material 315 or an n-side electrical contact material 317 is disposed. The p-side electrical contact material 315 and the n-side electrical contact material 317 may comprise at least one of nickel (Ni), nickel oxide (NiO), titanium-tungsten/gold (Ti—W/Au). In a preferred embodiment, the p-side electrical contact material 315 and/or the n-side electrical contact material 317 does not extend over the transparent dielectric. A reflective p-side electrical contact 113 is disposed over the transparent dielectric and the electrical contact material and electrically interconnects the electrical contact material 315 in the various grid openings. A reflective n-side electrical contact 114 is disposed over the transparent dielectric and the electrical contact material and electrically interconnects the electrical contact material 317 in the various grid openings. The reflective mirror layers 113 and 114 also cooperate with the transparent dielectric 319 to define a reflector for reflecting light within the device. Further variations of the reflective metallic contact are described in U.S. Pat. No. 7,119,372, which is hereby incorporated by reference in its entirety.

Figure 13A:
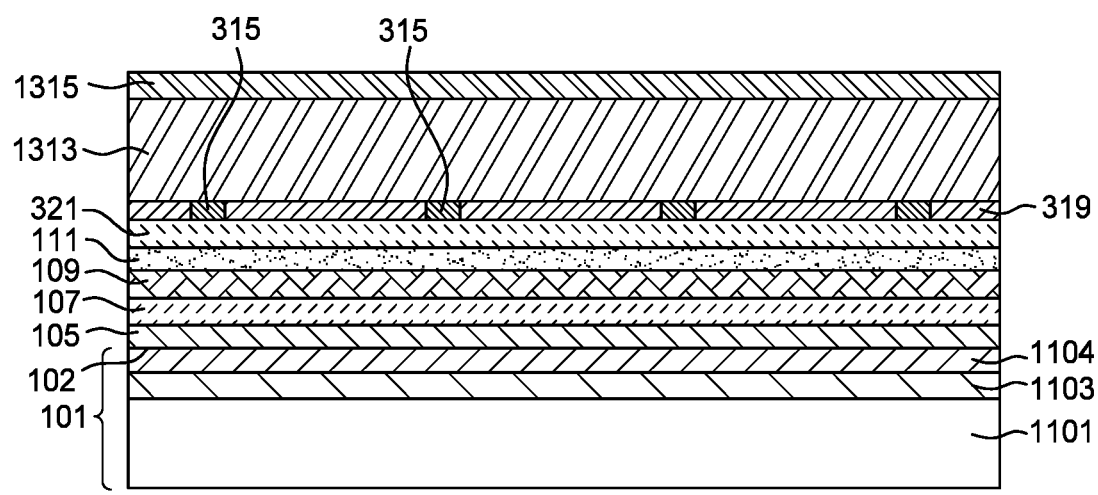
FIGS. 13A and 13D are simplified diagrams illustrating another alternative nitride-based power photodiode structure that has been prepared according to an embodiment of the present disclosure.
Figure 13B:
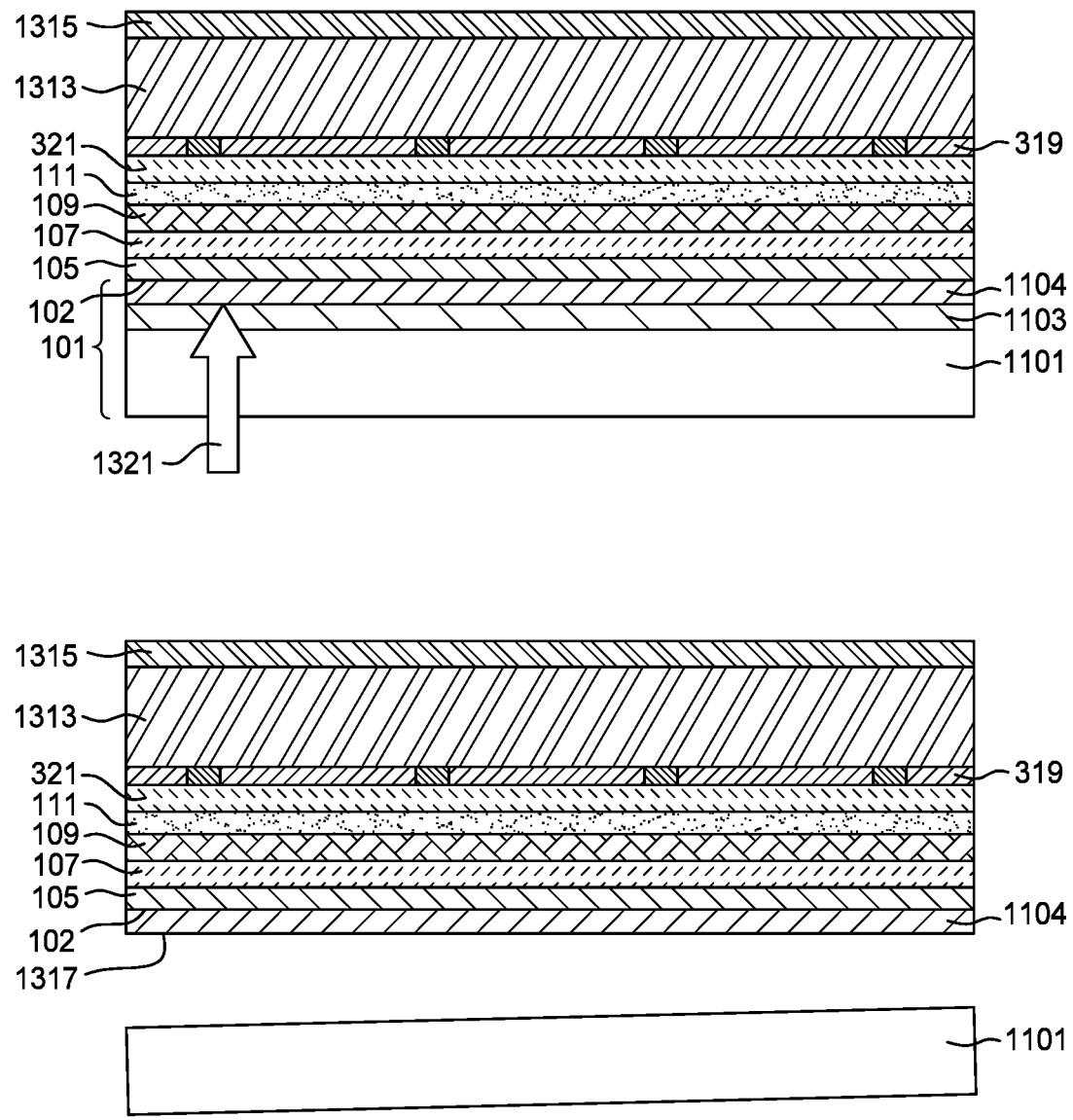
FIGS. 13B and 13C are simplified diagrams illustrating methods to remove a substrate from a nitride-based power photodiode structure according to embodiments of the present disclosure.

In another set of embodiments, as illustrated schematically in FIGS. 13A and 13B, the semiconductor layers are transferred to one or more carrier substrates 1313 and the template substrate 1101 removed. By comparison to the structure illustrated schematically in FIG. 3, the p-side electrical contact may similarly comprise a semi-transparent current-spreading layer 321 and a discontinuous p-electrode 315, and may further comprise a transparent dielectric 319 disposed on portions of the semitransparent current-spreading layer 321. A carrier substrate 1313 is then bonded to one or more of the p-type layer 111, the semi-transparent current spreading layer 321, if present, the discontinuous p-side electrode 315, if present, and the transparent dielectric 319, if present. The bonding of carrier substrate 1313 may be achieved by means of an adhesive, by means of a thermo-compression bond between one or more adhesion layers (not shown) deposited on at least one of a first surface of carrier substrate 1313 and the layer to which it is to be bonded, or by alternative bonding methods that are known in the art. In certain embodiments, carrier substrate 1313 and the adhesion layers are transparent at the wavelengths of interest for the photodiode, for example, between 390 nanometers and 460 nanometers. In certain embodiments, carrier substrate 1313 includes or consists of one or more of a glass, a transparent ceramic, silica glass, borosilicate glass, aluminosilicate glass, quartz, sapphire, $MgAl_2O_4$ spinel, zinc oxide or aluminum oxynitride. The adhesion layers may include or consist of one or more of $SiO_x$, $GeO_x$, $SiN_x$, $AlN_x$, $GaO_x$, $Al_2O_3$, $Sc_2O_3$, $Y_2O_3$, $B_2O_3$, $R_2O_3$, where R is a rare earth element, MgO, CaO, SrO, $HfO_2$, $ZrO_2$, $Ta_2O_5$, or B, Al, Si, P, Zn, Ga, Si, Ge, Au, Ag, Ni, Ti, Cr, Zn, Cd, In, Sn, Sb, Tl, or Pb, or an oxide, nitride, or oxynitride thereof. The adhesion layers may be deposited by thermal evaporation, electron-beam evaporation, sputtering, chemical vapor deposition, plasma-enhanced chemical vapor deposition, or the like, or by thermal oxidation of a deposited metallic film. The thickness of the adhesion layers may between about 1 nanometer and about 10 microns, or between about 10 nanometers and about 1 micron. The adhesion layer(s) may be annealed, for example, to a temperature between about 300 degrees Celsius and about 1000 degrees Celsius. In some embodiments, at least one adhesion layer is chemical-mechanically polished. In a preferred embodiment, the root-mean-square surface roughness of at least one adhesion layer is below about 0.5 nanometer, or below about 0.3 nanometer over a 20×20 $\mu m^2$ area. In certain embodiments, the thermo-compression bonding is performed in a clean room, with less than 10,000, less than 1,000, less than 100, or less than 10 particles per cubic centimeter in the air. Particles may be removed from at least one of the surfaces immediately prior to wafer bonding by spraying, brushing, or rinsing with ionized nitrogen, a $CO_2$ jet, $CO_2$ snow, high-resistivity water, an organic solvent, such as methanol, ethanol, isopropanol, acetone, or the like. In some embodiments, the opposing surfaces are brought into contact while immersed in a liquid. Optionally, at least one of the surfaces is exposed to a plasma to enhance wafer bonding. The pressure between opposing surfaces during the thermo-compression bonding process may be between about 0.1 megapascals and about 100 megapascals, and the temperature may be held at between about 30 degrees Celsius and about 950 degrees Celsius, between about 30 degrees Celsius and about 400 degrees Celsius, or between about 30 degrees Celsius and about 200 degrees Celsius for a period between about 5 minutes and about 10 hours.

A p-side reflective layer 1315 is deposited on the opposite surface of carrier substrate 1313 from the photodiode structure. P-side reflective layer 1315 may include or consist of one or more of silver, a dielectric mirror, and a distributed Bragg reflector (DBR). P-side reflective layer 1315 may have a reflectivity, at a specific angle or range of angles at which light is incident during operation, above about 80%, above about 85%, above about 90%, or above about 95% at the design wavelength of the photodiode, for example, between 360 nanometers and 460 nanometers.

The photodiode structure may be separated from the template substrate 1101 by a laser lift-off method, as shown schematically in FIG. 13B. A laser beam 1321 may be rastered over the backside of substrate 101. In certain embodiments, where nitride layer 1104 is deposited on a template substrate 1101 such as sapphire, an ultraviolet laser beam may be focused on the interface between nitride layer 1104 and template substrate 1101, causing localized decomposition of the backside of nitride layer 1104 and formation of micro- or nano-bubbles of $N_2$ and resulting in separation of template substrate 1101 from the balance of the photodiode structure. In certain embodiments, where nitride layer 1104 is deposited on a release layer 1103 having an optical absorption coefficient greater than 1000 cm$^{-1}$ at at least one wavelength where the balance of template substrate 1101 is substantially transparent, with an optical absorption coefficient less than 50 cm$^{-1}$, laser beam 1321 having a wavelength where release layer 1103 is strongly absorbing may be focused on release layer 1103, causing localized decomposition and formation of micro- or nano-bubbles of $N_2$ and resulting in separation of template substrate 1101 from the balance of the photodiode structure. The optimal degree of weakening of the interface, without causing undesired damage to the high quality epitaxial layer or the semiconductor structure, may achieved by adjusting the temperature of the photodiode structure, the laser power, the laser spot size, the laser pulse duration, and/or the number of laser pulses. The laser fluence to effect separation may be between 300 and 900 millijoules per square centimeter or between about 400 mJ/cm$^2$ and about 750 mJ/cm$^2$. The uniformity of the laser beam 1321 may be improved by inclusion of a beam homogenizer in the beam path, and the beam size may be about 4 mm by 4 mm. In some embodiments, the laser beam 1321 is scanned or rastered across the release layer rather than being held stationary. Separation may be performed at a temperature above the melting point of the metal produced by decomposition, e.g., above about 30 degrees Celsius in the case of gallium metal.

Figure 13C:
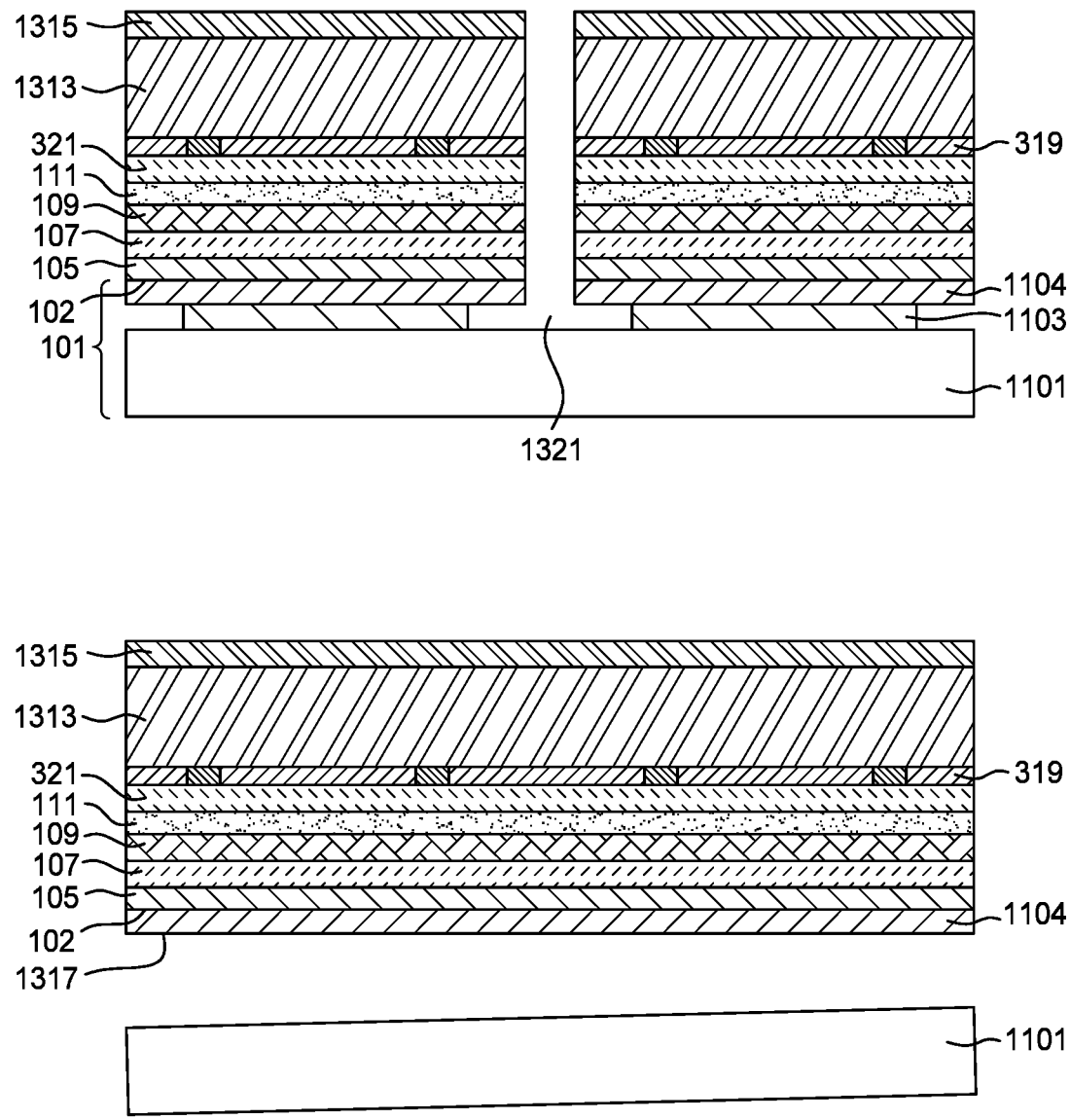

Alternatively, the photodiode structure may be separated from the template substrate 1101 by photoelectrochemical etching, as shown schematically in FIG. 13C, in cases where the release layer 1103 comprises InGaN and has a bandgap less than that of the absorber layer. Trenches 1321 may be formed between adjacent carrier substrates 1313 though each of the semiconductor layers down to release layer 1103, forming mesas. Trenches 1321 may be formed by dry etching or wet etching following conventional lithography, as is well known in the art. The photodiode structure is then immersed in a photoelectrochemical etching solution and illuminated with light having wavelengths that are strongly absorbed by the release layer 1103 but not by the other semiconductor layers. In certain embodiments the etch solution includes one or more of potassium hydroxide (KOH) potassium persulfate ($K_2S_2O_8$), sodium hydroxide (NaOH), hydrogen peroxide ($H_2O_2$), ethylene glycol, and tetramethylammonium hydroxide (TMAH). The KOH may have a concentration between 0.01 and 10 molar or between about 0.1 molar and about 2 molar. In certain embodiments, the light source includes a broadband source such as a mercury arc lamp, a mercury-xenon lamp, a tungsten lamp, or an LED, coupled with a filter to exclude wavelengths that are strongly absorbed by the semiconductor layers. The fluence of the light source may be between about 1 W/cm$^2$ and about 50 W/cm$^2$. In certain embodiments, the photodiode structure is connected electrically to an anode, with a separate cathode immersed in the etch solution, and an electrical current passed to cause dissolution of the release layer 1103, beginning from the bases of the trenches 1321 and extending laterally. In other embodiments, the photoelectrochemical etching process is electroless, with oxidation and dissolution of the release layer being driven by an oxidizing agent present in the etch solution such as $K_2S_2O_8$. After etching for a predetermined time, release layer 1103 is substantially dissolved, enabling easy removal of the photodiode structures from template substrate 1101.

Figure 13D:
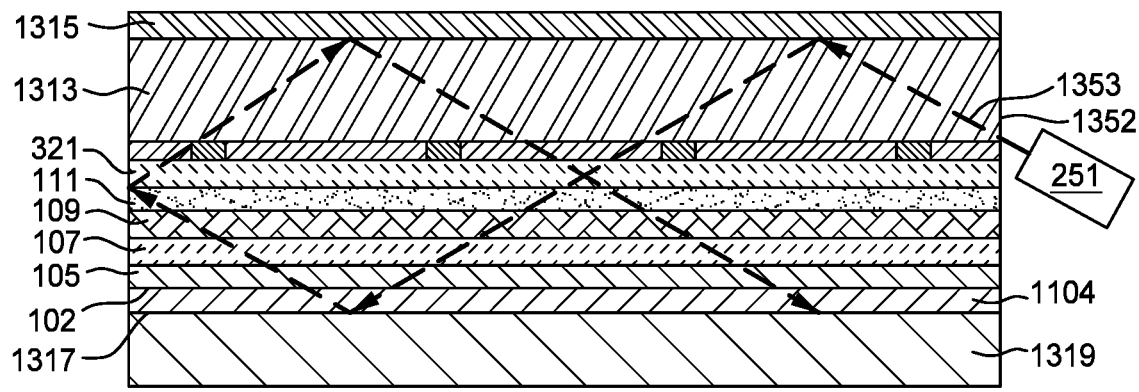

After removal of template substrate 1101, reflective n-side electrical contact 1319, with a reflectivity greater than about 70%, greater than about 80%, or greater than about 90% at a specific angle or range of angles at which light is incident during operation, may deposited on the freshly-exposed back side surface 1317 of nitride layer 1104, as shown schematically in FIG. 13D and described above. In some embodiments, surface 1317 is cleaned, by one or more of a wet process or a dry process, prior to deposition of reflective n-side contact 1319. During operation, light from illumination source 251 passes through an aperture or light receiving surface 1352, enters carrier substrate 1313 as beam 1353, and is multiply reflected between p-side reflector layer 1315 and reflective n-side contact 1319.

Figure 14A:
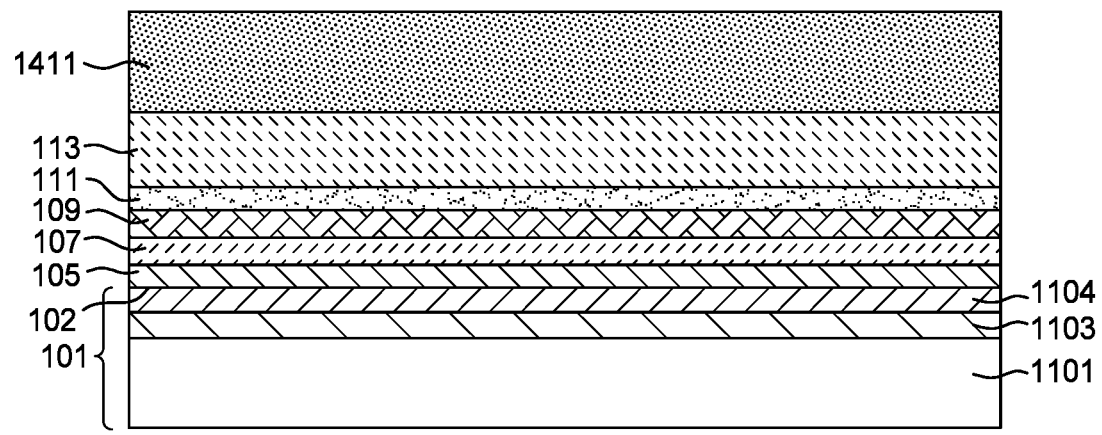
FIGS. 14A and 14B are simplified diagrams illustrating an alternate photodiode structure that has been prepared according to an embodiment of the present disclosure.
Figure 14B:
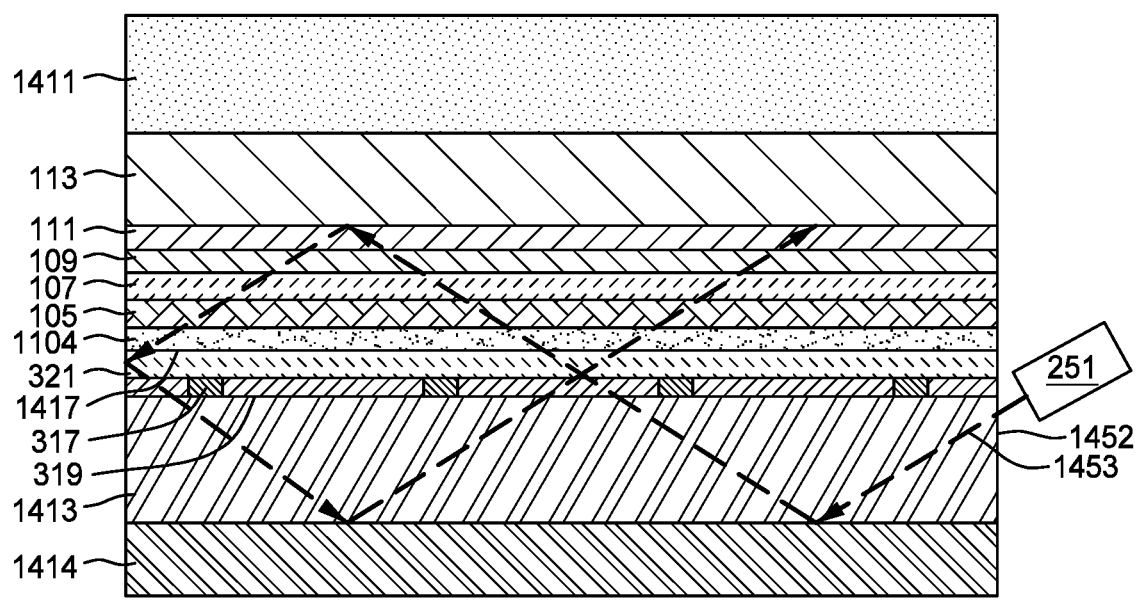

Variations of the template substrate removal and carrier substrate bonding process are possible. For example, a non-transparent, first carrier substrate 1411 may be bonded to reflective p-side contact layer 113, as shown schematically in FIG. 14A. Then, following removal of template substrate 1101, a semi-transparent current-spreading layer 321 may be deposited on the freshly-exposed back side surface 1417 of nitride layer 1104, as shown schematically in FIG. 14B and described above. The semi-transparent current-spreading layer 321 facilitates electrical contact to the n-type GaN layer 1104 for example, ohmic or quasi-ohmic behavior. In some embodiments, a transparent dielectric 319 is disposed on a portion of the semitransparent current-spreading layer 321 and between discontinuous n-side electrical contacts 317. A first surface of a second carrier substrate 1413, transparent at the wavelengths of interest, may then be bonded to layers 321, 317, and/or 319. An n-side reflector layer 1414 may then be deposited on a second surface of the second carrier substrate 1413. Now, light from illumination source 251 passes through an aperture or light receiving surface 1452, enters carrier substrate 1313 as beam 1453, and is multiply reflected between reflective p-side contact layer 113 and n-side reflector layer 1414.

In certain embodiments, the photodiode structure may be characterized prior to singulation. For example, the optical properties, such as transmission or reflection, may be investigated by optical absorption spectroscopy. The morphology of one or more layers may be characterized by differential interference contrast microscopy (DICM, or Nomarski) and/ or by atomic force microscopy. The luminescence properties of one or more epitaxial layers may be characterized by one or more of photoluminescence spectroscopy, photoluminescence microscopy, and microfluorescence. The impurity concentrations in one or more layers may be characterized by calibrated secondary ion mass spectrometry (SIMS). The crystallinity of one or more epitaxially grown layers may be characterized by x-ray diffraction. The electrical properties of one or more layers may be characterized by Hall measurements, Van der Pauw measurements, or non-contact resistivity measurements. The contact resistance and series resistance of one or more of the p-side and n-side contacts and of one or more layers may be investigated by transmission line measurements (TLM). The photodiode electrical properties and power conversion efficiency may be characterized by current-voltage (I-V) measurements, either in the dark or under illumination by conventional or laser light sources of various intensities. Minority carrier collection within the photodiode structure may be quantified by quantum efficiency measurements. The photodiode structure may be further characterized by electroluminescence measurements.

After wafer-level fabrication, individual photodiode die may be separated, for example, by laser scribing and cleaving, by laser cutting, by die sawing, or the like, and packaged. The scribe and cleave direction relative to the crystal axes may be chosen to control the morphology of the edges. For example, c-plane wafers may be cleaved along the m-plane for a smooth cleaved surface, or along the a-plane for a rough cleaved surface composed of m-plane facets.

EXAMPLES

Embodiments provided by the present disclosure are further illustrated by reference to the following comparative examples and exemplary process examples. It will be apparent to those skilled in the art that many modifications, both to materials, and methods, may be practiced without departing from the scope of the disclosure.

Comparative Example 1

Figure 5:
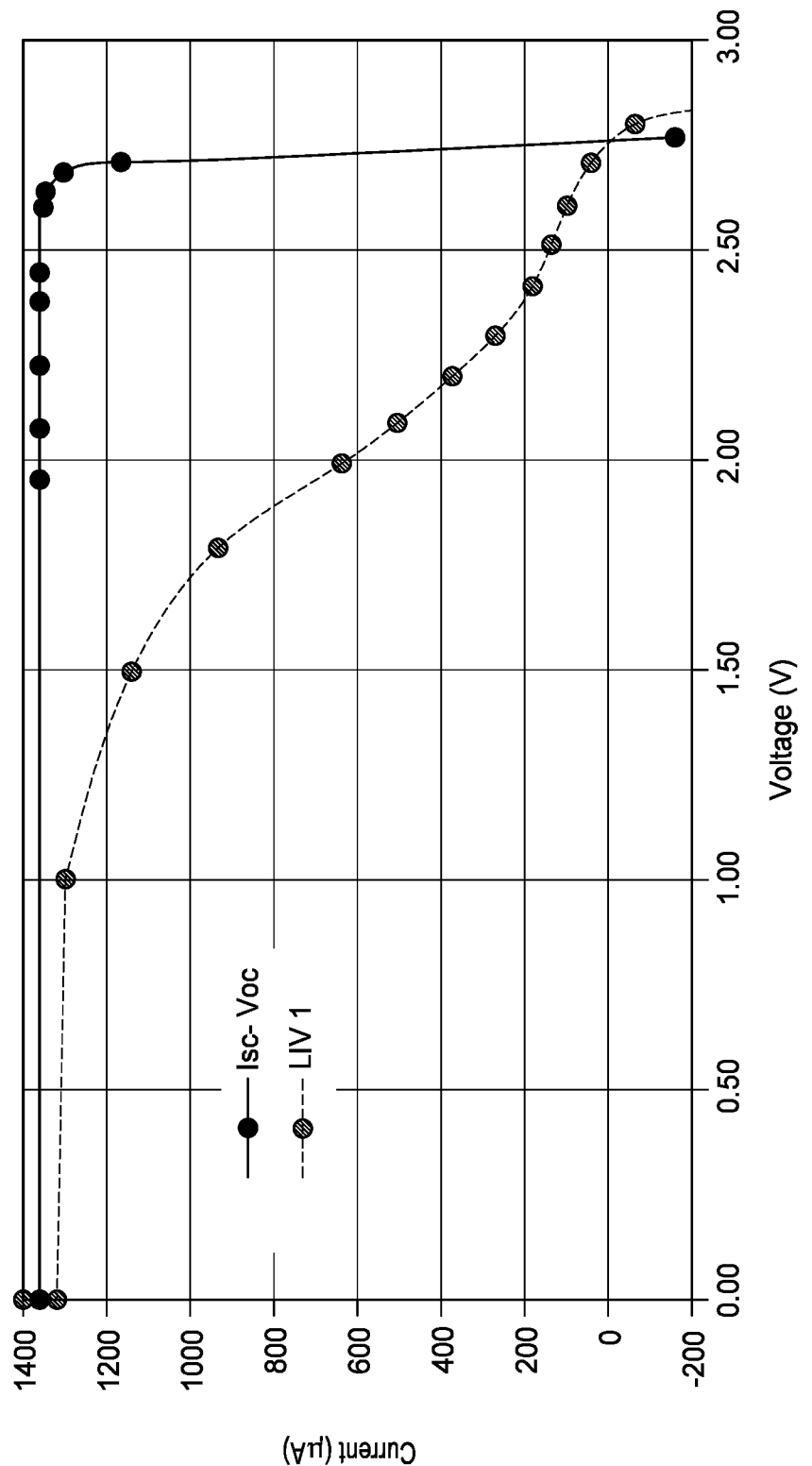
FIG. 5 is a simplified diagram illustrating the illuminated current-voltage behavior and fill factor of a photodiode according to a first comparative embodiment of the present disclosure.

As a point of comparison, a +c-plane, GaN-on-GaN die was harvested from a commercial LED emitting at approximately 405 nanometers and utilized as a photodiode. The LED structure is believed to include an AlGaN electron blocking layer underlying a p-type GaN layer and a multi-quantum-well MQW structure comprising InGaN well layers and GaN barrier layers. The LED structure is believed not to include either highly-doped layers or doped, reduced-bandgap layers directly adjoining the MQW layers. The reverse current-voltage characteristics were recorded under dark and light conditions, where illumination was provided by a commercial 405 nm laser diode. The results are shown in FIG. 5 as the "LIV" curve. From the measured results, $V_{oc}$ was evaluated as 2.74 V, $E_g$=3.06 eV, $I_{sc}$=2.6 A/cm², $eV_{oc}/E_g$=0.89, and FF=46%. The values of $V_{oc}$ and of $I_{sc}$ are seen to be relatively good, whereas the low value for the fill factor indicates that improved device designs are needed. By contrast, a curve with a relatively high fill factor is shown for comparison in FIG. 5.

Comparative Example 2

Figure 6:
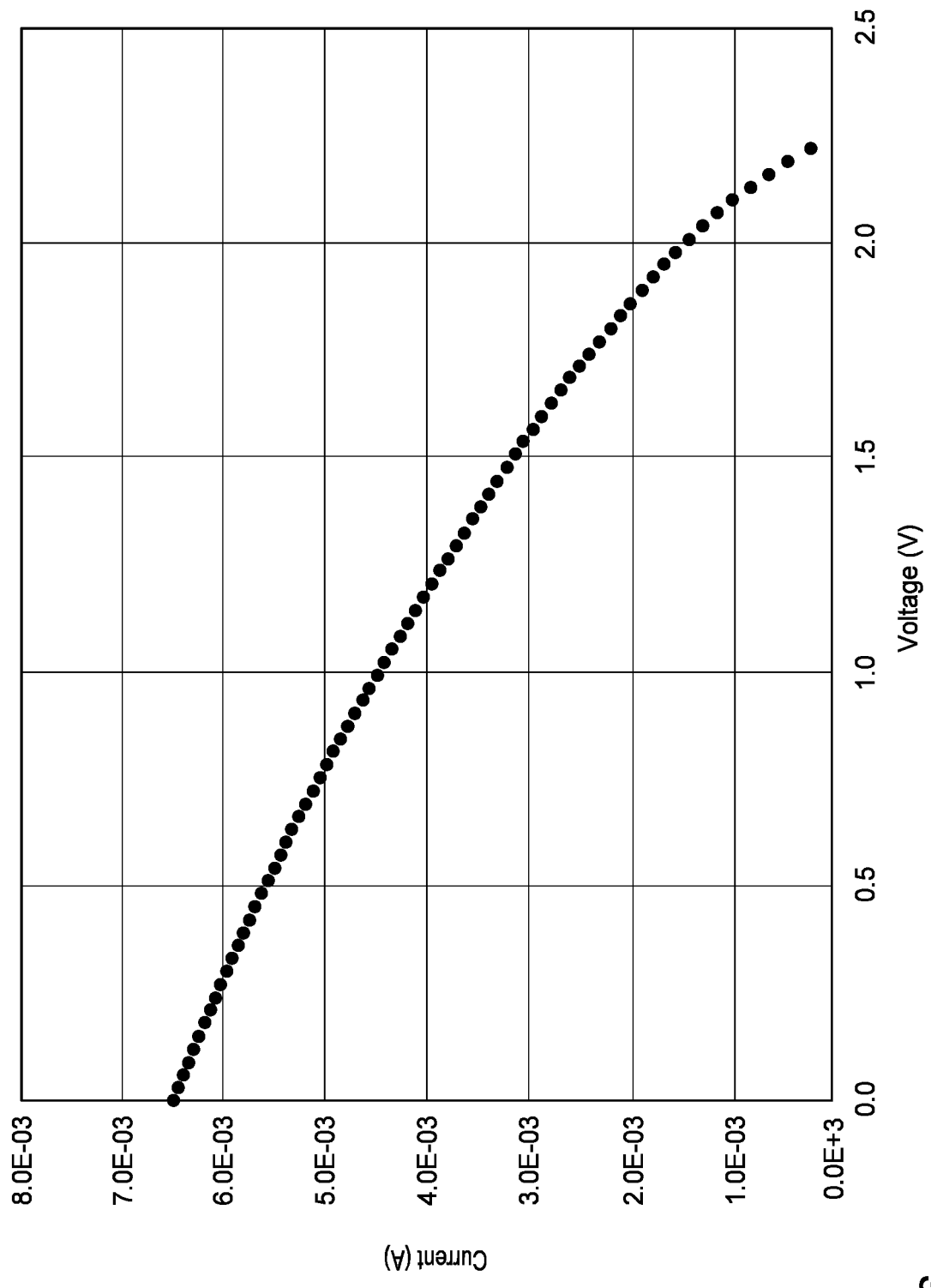
FIG. 6 is a simplified diagram illustrating the illuminated current-voltage behavior and fill factor of a photodiode according to a second comparative embodiment of the present disclosure.

An epitaxial structure, including a 500 nanometer n-type doped GaN layer containing Si dopant at a concentration of $2\times10^{18}$ cm⁻³, followed by a 100 nanometer n-type doped GaN layer containing Si dopant at a concentration of $4\times10^{18}$ cm⁻³, followed by an unintentionally doped absorber layer, followed by a 90 nanometer p-type doped layer containing Mg at a concentration of $1\times10^{19}$ cm⁻³, followed by a 10 nanometer p+-type doped layer containing Mg at a concentration of $1\times10^{20}$ cm⁻³, was deposited on a bulk GaN substrate miscut from (0001) by approximately 0.4 degrees toward [10-10]. The absorber layer was unintentionally doped and consisted of a 7 nanometer GaN layer followed by 10 alternating layers of 4 nanometer $In_{0.14}Ga_{0.86}N$ well layers and 7 nanometer GaN barrier layers. The structure was characterized by an electroluminescence peak at approximately 447 nanometers. The reverse current-voltage characteristics were recorded under dark and light conditions, where illumination was provided by a commercial 405 nm laser diode. The results are shown in FIG. 6. From the measured results, $V_{oc}$ was evaluated as 2.32 V, $E_g$=2.77 eV, $I_{sc}$=6.5×10⁻³ A, $eV_{oc}/E_g$=0.84, and FF=33%. The values of $V_{oc}$ and of $I_{sc}$ are seen to be relatively good, whereas the low value for the fill factor indicates that improved device designs are needed.

Comparative Example 3

Figure 11:
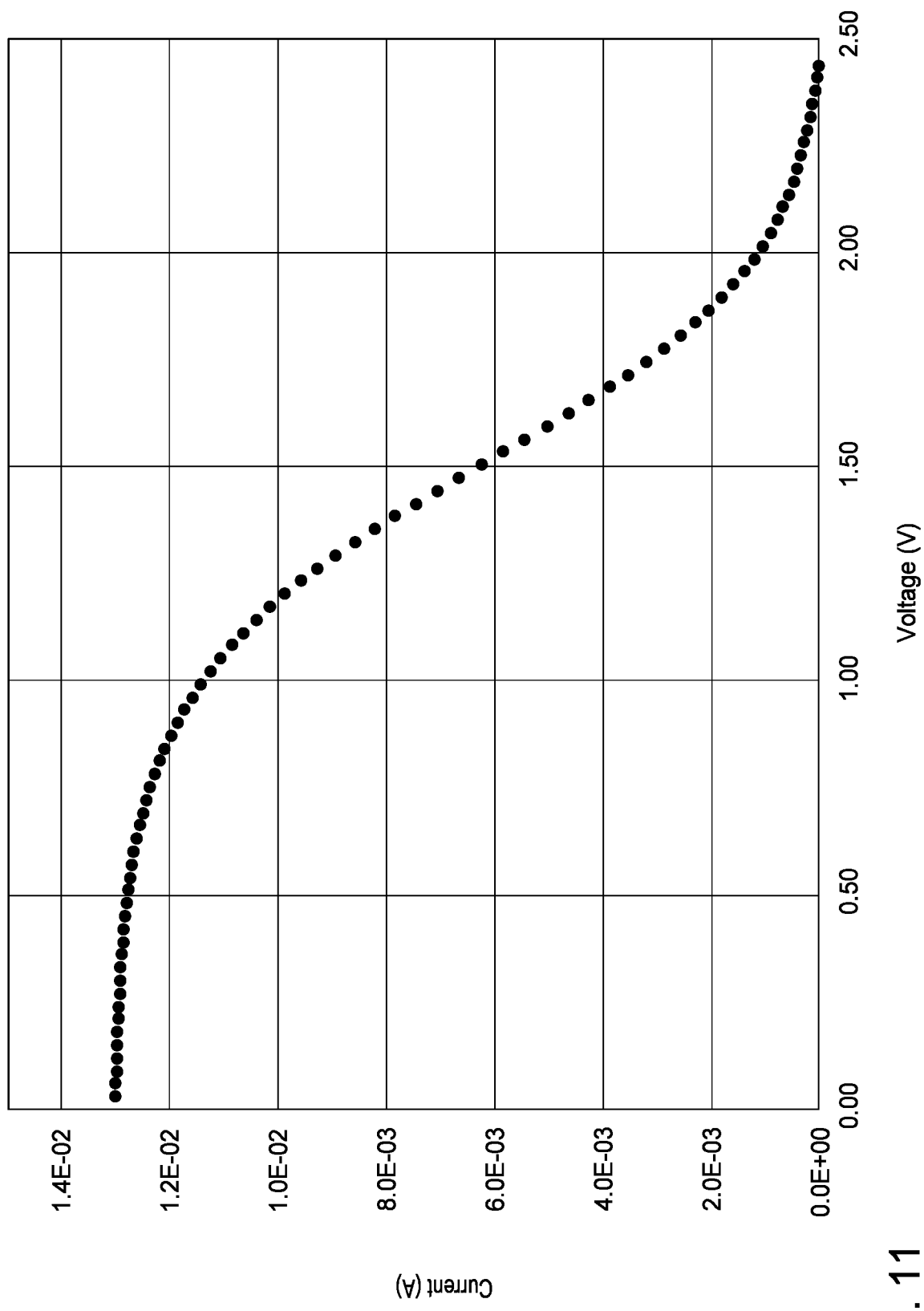
FIG. 11 is a simplified diagram showing photocurrent as a function of applied voltage for an illuminated photodiode structure according to an embodiment of the current disclosure.

An epitaxial structure, including a 1000 nanometer n-type doped GaN layer containing Si dopant at a concentration of $2.0\times10^{18}$ cm⁻³, followed by a 30 nanometer n-type doped GaN layer containing Si dopant at a concentration of $2\times10^{19}$ cm⁻³, followed by an unintentionally doped absorber layer, followed by a 50 nanometer p-type doped layer containing Mg at a concentration of $2\times10^{19}$ cm⁻³, followed by a 10 nanometer p+-type doped layer containing Mg at a concentration of $1\times10^{20}$ cm⁻³, was deposited on a bulk GaN substrate miscut from (0001) by approximately 0.4 degrees toward [10-10]. The absorber layer was unintentionally doped and consisted of a 40 nanometer double-heterostructure $In_{0.13}Ga_{0.87}N$ layer. The structure was characterized by an electroluminescence peak at approximately 435 nanometers. The reverse current-voltage characteristics were recorded under dark and light conditions, where illumination was provided by a commercial 405 nm laser diode. The results are shown in FIG. 11. From the measured results, $V_{oc}$ was evaluated as 2.43 V, $E_g$=2.85 eV, $I_{sc}$=0.013 A, $eV_{oc}/E_g$=0.85, and FF 38%. The values of $V_{oc}$ and of $I_{sc}$ are seen to be relatively good, whereas the low value for the fill factor indicates that improved device designs are needed.

Comparative Example 4

An epitaxial structure, including a 1000 nanometer n-type doped GaN layer containing Si dopant at a concentration of $2.0\times10^{18}$ cm⁻³, followed by a 100 nanometer n-type doped GaN layer containing Si dopant at a concentration of $5.0\times10^{17}$ cm⁻³, followed by an unintentionally doped absorber layer, followed by a 50 nanometer p-type doped layer containing Mg at a concentration of $2\times10^{20}$ cm⁻³, followed by a 10 nanometer p+-type doped layer containing Mg at a concentration of $1\times10^{20}$ cm⁻³, is deposited on a bulk GaN substrate miscut from (0001) by approximately 0.4 degrees toward [10-10]. The absorber layer is unintentionally doped and consists of a 40 nanometer double-heterostructure $In_{0.18}Ga_{0.82}N$ layer. The structure is characterized by an electroluminescence peak at approximately 473 nanometers. The reverse current-voltage characteristics are recorded under dark and light conditions, where illumination is provided by a commercial 405 nm laser diode. From the measured results, $V_{oc}$ is evaluated as 2.20 V, $E_g$=2.62 eV, $eV_{oc}/E_g$=0.84, and FF 45%. The value of $V_{oc}$ is seen to be relatively good, whereas the low value for the fill factor indicates that improved device designs are needed.

Example 1

An epitaxial structure, including a 1000 nanometer n-type doped GaN layer containing Si dopant at a concentration of $2.0\times10^{18}$ cm$^{-3}$, followed by a 30 nanometer n-type doped GaN layer containing Si dopant at a concentration of $3.0\times10^{19}$ cm$^{-3}$, followed by an unintentionally doped absorber layer, followed by a 50 nanometer p-type doped layer containing Mg at a concentration of $3\times10^{19}$ cm$^{-3}$, followed by a 10 nanometer p+-type doped layer containing Mg at a concentration of $1\times10^{20}$ cm$^{-3}$, is deposited on a bulk GaN substrate miscut from (0001) by approximately 0.4 degrees toward [10-10]. The absorber layer is unintentionally doped and consists of a 40 nanometer double-heterostructure In$_{0.13}$Ga$_{0.87}$N layer. The structure is characterized by an electroluminescence peak at approximately 435 nanometers. The reverse current-voltage characteristics are recorded under dark and light conditions, where illumination is provided by a commercial 405 nm laser diode. From the measured results, $V_{oc}$ is evaluated as 2.43 V, $E_g$=2.85 eV, $eV_{oc}/E_g$=0.85, and FF 85%.

Example 2

An epitaxial structure, including a 1000 nanometer n-type doped GaN layer containing Si dopant at an average concentration of $2.0\times10^{18}$ cm$^{-3}$, followed by a 30 nm n-type doped GaN layer containing Si at an average concentration of $4.0\times10^{19}$ cm$^{-3}$, followed by an unintentionally doped absorber layer, followed by a 50 nanometer p-type doped layer containing Mg at a concentration of $2\times10^{20}$ cm$^{-3}$, is deposited on a bulk GaN substrate miscut from (0001) by approximately 0.4 degrees toward [10-10]. The absorber layer is unintentionally doped and consists of a 40 nanometer double-heterostructure In$_{0.18}$Ga$_{0.82}$N layer. The structure is characterized by a photoluminescence peak at approximately 473 nanometers. The reverse current-voltage characteristics are recorded under dark and light conditions, where illumination is provided by a commercial 405 nm laser diode. From the measured results, $V_{oc}$ is evaluated as 2.20 V, $E_g$=2.62 eV, $eV_{oc}/E_g$=0.84, and FF 91%.

Example 3

An epitaxial structure, including a 1000 nanometer n-type doped GaN layer containing Si dopant at an average concentration of $2.0\times10^{18}$ cm$^{-3}$, followed by a 100 nm n-type doped GaN layer containing Si at an average concentration of $5.0\times10^{17}$ cm$^{-3}$, followed by an approximately 6 nm thick compositionally-graded InGaN layer with an initial composition of GaN and final composition of approximately In$_{0.18}$Ga$_{0.72}$N and a Si dopant concentration of approximately $5.0\times10^{17}$ cm$^{-3}$ followed by an unintentionally doped absorber layer, followed by a 50 nanometer p-type doped layer containing Mg at a concentration of $2\times10^{20}$ cm$^{-3}$, is deposited on a bulk GaN substrate miscut from (0001) by approximately 0.4 degrees toward [10-10]. The absorber layer is unintentionally doped and consists of a 40 nanometer double-heterostructure In$_{0.18}$Ga$_{0.82}$N layer. The structure is characterized by a photoluminescence peak at approximately 473 nanometers. The reverse current-voltage characteristics are recorded under dark and light conditions, where illumination is provided by a commercial 405 nm laser diode. From the measured results, $V_{oc}$ is evaluated as 2.20 V, $E_g$=2.62 eV, $eV_{oc}/E_g$=0.84, and FF 85%.

Example 4

Figure 12:
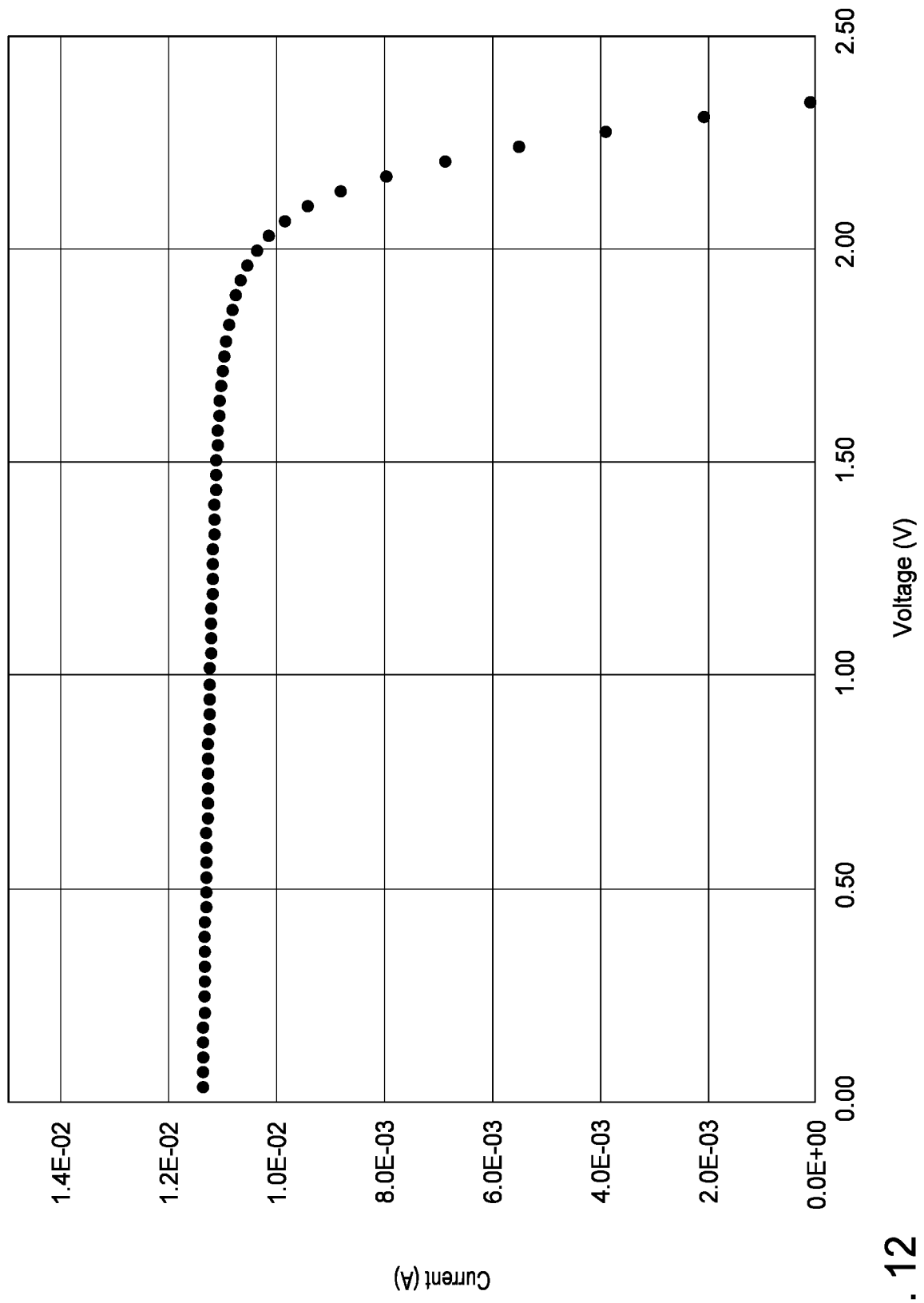
FIG. 12 is a simplified diagram showing photocurrent as a function of applied voltage for an illuminated photodiode structure according to an embodiment of the current disclosure.

An epitaxial structure, including a 300 nanometer n-type doped GaN layer containing Si dopant at an average concentration of $3.5\times10^{18}$ cm$^{-3}$, followed by an InGaN—GaN strained-layer-superlattice (SLS), followed by an approximately 6 nm thick compositionally-graded InGaN layer with an initial composition of approximately In$_{0.04}$Ga$_{0.96}$N and final composition of approximately In$_{0.2}$Ga$_{0.8}$N and a Si dopant concentration of approximately $4.0\times10^{17}$ cm$^{-3}$, followed by a 9-period multi-quantum well structure comprised of 3 nm In$_{0.2}$Ga$_{0.8}$N wells and 9 nm GaN barrier layers containing Si dopant at a concentration of approximately $3\times10^{17}$ cm$^{-3}$, followed by a 100 nanometer p-type doped layer containing Mg at a concentration of approximately $2\times10^{20}$ cm$^{-3}$, was grown on a sapphire substrate with the substrate surface normal within 5 degrees of the [0001] of the nitride epitaxial layers. The absorber layer consisted of the 9-period multi-quantum well structure. The structure was characterized by a photoluminescence peak at approximately 457 nanometers. The reverse current-voltage characteristics of fabricated devices were recorded under dark and light conditions, where illumination was provided by a commercial 405 nm laser diode. The results are shown in FIG. 12. From the measured results, $V_{oc}$ was evaluated as 2.34 V, $E_g$=2.71 eV, $I_{sc}$=0.0114 A, $eV_{oc}/E_g$=0.86, and FF 78%. The values of $V_{oc}$, $I_{sc}$, and FF are seen to be relatively good. The measured FF is artificially low due to series resistance arising from the method of electrically probing the n metal contact.

Example 5

An epitaxial structure, including a 1000 nanometer n-type doped GaN layer containing Si dopant at an average concentration of $1.0\times10^{18}$ cm$^{-3}$, followed by an unintentionally-doped, 20-period multi-quantum well structure comprised of 2 nm In$_{0.18}$Ga$_{0.82}$N wells and 4 nm GaN barrier layers, followed by a 50 nanometer p-type doped layer containing Mg at a concentration of approximately $2\times10^{18}$ cm$^{-3}$, is deposited on a bulk GaN substrate miscut from (000-1) by approximately 4 degrees toward [10-10]. The absorber layer consisted of the 9-period multi-quantum well structure. The structure is characterized by a photoluminescence peak at approximately 470 nanometers. The reverse current-voltage characteristics are recorded under dark and light conditions, where illumination is provided by a commercial 405 nm laser diode. From the measured results, $V_{oc}$ is evaluated as 2.20 V, $E_g$=2.63 eV, $eV_{oc}/E_g$=0.84, and FF 88%.

Example 6

An epitaxial structure, including a 1000 nanometer n-type doped GaN layer containing Si dopant at an average concentration of $5.0\times10^{18}$ cm$^{-3}$, followed by an unintentionally-doped, 20-period multi-quantum well structure comprised of 2 nm In$_{0.18}$Ga$_{0.82}$N wells and 4 nm GaN barrier layers, followed by a 100 nanometer p-type doped layer containing Mg at a concentration of approximately $1\times10^{19}$ cm$^{-3}$, is deposited on a bulk GaN substrate having a crystallographic orientation within 0.1 degree of (30-3-1). The structure is characterized by a photoluminescence peak at approximately 470 nanometers. The reverse current-voltage characteristics are recorded under dark and light conditions, where illumination is provided by a commercial 405 nm laser diode. From the measured results, $V_{oc}$ is evaluated as 2.20 V, $E_g$=2.63 eV, $eV_{oc}/E_g$=0.84, and FF 88%.

While the foregoing is directed to embodiments of the present disclosure, other and further embodiments of the disclosure may be devised without departing from the basic scope thereof, and the scope thereof is determined by the claims that follow.

What is claimed is:

1. A photodiode structure, comprising:
a substrate having a first surface and a second surface, wherein
the second surface is opposite to the first surface,
the substrate is a single-crystalline group-III metal nitride, and
the first surface of the substrate has a crystallographic orientation within 5 degrees of (0001) +c-plane, {10-10} m-plane, or a semipolar plane selected from one of {11-2±2}, {60-6±1}, {50-5±1}, {40-4±1}, {30-3±1}, {50-5±2}, {70-7±3}, {20-2±1}, {30-3±2}, {40-4±3}, {50-5±4}, {10-1±1}, {1 0 −1 ±2}, {1 0 −1 ±3}, or differs from (000-1) by between 2 degrees and 5 degrees;
an n-type layer and a p-type layer that are disposed over the first surface of the substrate, wherein the n-type layer and the p-type layer each comprise $Al_xIn_yGa_{1-x-y}N$, where $0 \leq x, y, x+y \leq 1$, and have a dopant concentration of at least $1 \times 10^{16}$ cm$^{-3}$;
one or more absorber layers disposed between the n-type and the p-type layers, wherein the one or more absorber layers comprise $Al_xIn_yGa_{1-x-y}N$, where $0 \leq x, y, x+y \leq 1$ and have a dislocation density below about $10^9$ cm$^{-2}$;
a p-side electrical contact layer disposed over the p-type layer, wherein the p-side electrical contact layer has an average reflectance of at least 70% for at least one wavelength between 390 nanometers and 460 nanometers and a contact resistance below $3 \times 10^{-3}$ Ωcm$^2$;
an n-side electrical contact layer disposed over the second surface of the substrate, wherein the n-side electrical contact layer has an average reflectance of at least 70% for at least one wavelength between 390 nanometers and 460 nanometers and a contact resistance below $1 \times 10^{-3}$ Ωcm$^2$; and
a light receiving surface, wherein the light receiving surface is aligned to cause light, having at least one wavelength between 390 nanometers and 460 nanometers and incident on the light receiving surface at an angle, to be reflected at least once from the n-side electrical contact layer and from the p-side electrical contact layer, wherein the photodiode structure is characterized by a fill factor of at least 50%.

2. The photodiode structure of claim 1, wherein the fill factor is achieved under an illumination level producing a current density of at least 10 A cm$^{-2}$.

3. The photodiode structure of claim 1, wherein the fill factor is at least 80%.

4. The photodiode structure of claim 1, wherein the fill factor is at least 90%.

5. The photodiode structure of claim 1, wherein each of the one or more absorber layers, the n-type layer, and the p-type layer are characterized by a crystallographic orientation within 5 degrees of (0001) +c-plane and each of the n-type and p-type layers are characterized by a dopant concentration of at least $1 \times 10^{19}$ cm$^{-3}$.

6. The photodiode structure of claim 1, further comprising at least one of an n-type cladding layer and a p-type cladding layer, wherein
the n-type cladding layer lies between the n-type layer and the one or more absorber layers,
the n-type cladding layer has a dopant concentration of at least $5 \times 10^{18}$ cm$^{-3}$,
the p-type cladding layer lies between the one or more absorber layers and the p-type layer, and
the p-type cladding layer has a dopant concentration of at least $1 \times 10^{19}$ cm$^{-3}$.

7. The photodiode structure of claim 1, further comprising:
at least one of an n-type cladding layer and a p-type cladding layer,
the n-type cladding layer lying between the n-type layer and the one or more absorber layers, and
the p-type cladding layer lying between the one or more absorber layers and the p-type layer,
wherein the at least one of the n-type cladding layer and the p-type cladding layer is characterized by an indium concentration intermediate between that of the one or more absorber layers and that of the n-type layer or p-type layer.

8. The photodiode structure of claim 1, wherein each of the one or more absorber layers, the n-type layer, and the p-type layer are characterized by a crystallographic orientation that differs from (000-1) −c-plane by between 2 degrees and 5 degrees.

9. The photodiode structure of claim 1, wherein each of the one or more absorber layers, the n-type layer, and the p-type layer are characterized by a crystallographic orientation within 5 degrees of {10-10} m-plane and each of the n-type and p-type layers are characterized by a dopant concentration of at least $2 \times 10^{18}$ cm$^{-3}$.

10. The photodiode structure of claim 1, wherein each of the one or more absorber layers, the n-type layer, and the p-type layer are characterized by a crystallographic orientation within 5 degrees of a semipolar plane selected from {10-1-2}, {10-1-1}, {20-2-1}, and {30-3-1} and each of the n-type and p-type layers are characterized by a dopant concentration of at least $1 \times 10^{18}$ cm$^{-3}$.

11. The photodiode structure of claim 1, wherein
the p-side electrical contact layer is disposed over the p-type layer, and
has an average reflectance of at least 80% for at least one wavelength between 390 nanometers and 460 nanometers and a contact resistance below $1 \times 10^{-3}$ Ωcm$^2$.

12. The photodiode structure of claim 1, wherein the n-side electrical contact layer has an average reflectance of at least 80% for at least one wavelength between 390 nanometers and 460 nanometers and a contact resistance below $5 \times 10^{-4}$ Ωcm$^2$.

13. The photodiode structure of claim 1, wherein each of the n-type layer, the one or more absorber layers, and the p-type layer have a threading dislocation density below $10^7$ cm$^{-2}$.

14. The photodiode structure of claim 1, wherein each of the n-type layer, the one or more absorber layers, and the p-type layer have a threading dislocation density below $10^6$ cm$^{-2}$.

15. A photodiode structure, comprising:
one or more absorber layers, wherein the one or more absorber layers comprise $Al_xIn_yGa_{1-x-y}N$, where $0 \leq x, y, x+y \leq 1$;
an n-type layer and a p-type layer, wherein
the one or more absorber layers are disposed over the n-type layer,
the p-type layer is disposed over the one or more absorber layers, and
the n-type layer and the p-type layer each comprise $Al_xIn_yGa_{1-x-y}N$, where $0 \leq x, y, x+y \leq 1$, and have a dopant concentration of at least $1 \times 10^{16}$ cm$^{-3}$;
a carrier substrate having a first surface and a second surface, wherein
the first surface of the carrier substrate is disposed over the p-type layer or under the n-type layer, and the carrier substrate is substantially transparent at wavelengths between 390 nanometers and 460 nanometers;

a p-side electrical contact layer placed in electrical contact with the p-type layer, wherein the p-side electrical contact layer has a contact resistance below $3 \times 10^{-3}$ $\Omega cm^2$;

a p-side reflector layer disposed on one of the p-type layer and the second surface of the carrier substrate, the p-side reflector layer having an average reflectance of at least 70% for at least one wavelength between 390 nanometers and 460 nanometers;

an n-side electrical contact layer placed in electrical contact with the n-type layer, wherein the n-side electrical contact layer has a contact resistance below $1 \times 10^{-3}$ $\Omega cm^2$;

an n-side reflector layer disposed over one of an n-side layer and the second surface of the carrier substrate, the n-side reflector layer having an average reflectance of at least 70% for at least one wavelength between 390 nanometers and 460 nanometers; and a light receiving surface, wherein the light receiving surface is aligned to cause light, having at least one wavelength between 390 nanometers and 460 nanometers and incident on the light receiving surface at an angle, to be reflected at least once from the n-side reflector layer and from the p-side reflector layer, wherein the photodiode structure is characterized by a fill factor of at least 50%.

16. The photodiode structure of claim 15, wherein the fill factor is achieved under an illumination level producing a current density of at least 10 A $cm^{-2}$.

17. The photodiode structure of claim 15, wherein the fill factor is at least 80%.

18. The photodiode structure of claim 15, wherein the fill factor is at least 90%.

19. The photodiode structure of claim 15, wherein each of the one or more absorber layers, the n-type layer, and the p-type layer are characterized by a crystallographic orientation within 5 degrees of (0001) +c-plane and each of the n-type and p-type layers are characterized by a dopant concentration of at least $1 \times 10^{19}$ $cm^{-3}$.

20. The photodiode structure of claim 15, further comprising at least one of an n-type cladding layer and a p-type cladding layer, wherein the n-type cladding layer lies between the n-type layer and the one or more absorber layers, the n-type cladding layer has a dopant concentration of at least $5 \times 10^{18}$ $cm^{-3}$, the p-type cladding layer lies between the one or more absorber layers and the p-type layer, and the p-type cladding layer has a dopant concentration of at least $1 \times 10^{19}$ $cm^{-3}$.

21. The photodiode structure of claim 15, further comprising:

at least one of an n-type cladding layer and a p-type cladding layer, the n-type cladding layer lying between the n-type layer and the one or more absorber layers, and the p-type cladding layer lying between the one or more absorber layers and the p-type layer, wherein the at least one of the n-type cladding layer and the p-type cladding layer is characterized by an indium concentration intermediate between that of the one or more absorber layers and that of the n-type layer or p-type layer.

22. The photodiode structure of claim 15, wherein each of the one or more absorber layers, the n-type layer, and the p-type layer are characterized by a crystallographic orientation that differs from (000-1) –c-plane by between 2 degrees and 5 degrees.

23. The photodiode structure of claim 15, wherein each of the one or more absorber layers, the n-type layer, and the p-type layer are characterized by a crystallographic orientation within 5 degrees of {10-10} m-plane and each of the n-type and p-type layers are characterized by a dopant concentration of at least $2 \times 10^{18}$ $cm^{-3}$.

24. The photodiode structure of claim 15, wherein each of the one or more absorber layers, the n-type layer, and the p-type layer are characterized by a crystallographic orientation within 5 degrees of a semipolar plane selected from {10-1-2}, {10-1-1}, {20-2-1}, and {30-3-1} and each of the n-type and p-type layers are characterized by a dopant concentration of at least $1 \times 10^{18}$ $cm^{-3}$.

25. The photodiode structure of claim 15, wherein the p-side electrical contact layer:

is disposed over the p-type layer, and has an average reflectance of at least 80% for at least one wavelength between 390 nanometers and 460 nanometers and a contact resistance below $1 \times 10^{-3}$ $\Omega cm^2$.

26. The photodiode structure of claim 15, wherein the n-side electrical contact layer has an average reflectance of at least 80% for at least one wavelength between 390 nanometers and 460 nanometers and a contact resistance below $5 \times 10^{-4}$ $\Omega cm^2$.

* * * * *

UNITED STATES PATENT AND TRADEMARK OFFICE
CERTIFICATE OF CORRECTION

PATENT NO. : 11,444,216 B2
APPLICATION NO. : 16/930250
DATED : September 13, 2022
INVENTOR(S) : Drew W. Cardwell and Mark P. D'Evelyn It is certified that error appears in the above-identified patent and that said Letters Patent is hereby corrected as shown below:

In the Drawings

Sheet 15, Fig. 13C, the reference numeral '1321' should read -1322-.

In the Specification

Column 25, Line 51, Column 25, Line 54, and Column 26, Line 9, the reference numeral '1321', each occurrence, should read -1322-.

Signed and Sealed this
First Day of November, 2022

Katherine Kelly Vidal
Director of the United States Patent and Trademark Office